(12) United States Patent
Lee et al.

(10) Patent No.: US 11,737,280 B2
(45) Date of Patent: Aug. 22, 2023

(54) WAKEUP FREE APPROACH TO IMPROVE THE FERROELECTRICITY OF FERAM USING A STRESSOR LAYER

(71) Applicant: Taiwan Semiconductor Manufacturing Co., Ltd., Hsinchu (TW)

(72) Inventors: Bi-Shen Lee, Hsinchu (TW); Tzu-Yu Lin, Hsinchu (TW); Yi-Yang Wei, Hsinchu (TW); Hai-Dang Trinh, Hsinchu (TW); Hsun-Chung Kuang, Hsinchu (TW); Cheng-Yuan Tsai, Chu-Pei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/306,103

(22) Filed: May 3, 2021

(65) Prior Publication Data
US 2022/0285374 A1    Sep. 8, 2022

Related U.S. Application Data

(60) Provisional application No. 63/157,022, filed on Mar. 5, 2021.

(51) Int. Cl.
*H10B 51/30* (2023.01)
*H10B 53/30* (2023.01)

(52) U.S. Cl.
CPC ............. *H10B 51/30* (2023.02); *H10B 53/30* (2023.02)

(58) Field of Classification Search
CPC ......... H01L 27/10808; H01L 27/10847; H01L 27/10852; H01L 27/11502; H01L 27/11507; H01L 27/1159; H10B 51/10; H10B 51/20; H10B 51/30; H10B 53/10; H10B 53/20; H10B 53/30
See application file for complete search history.

(56) References Cited

U.S. PATENT DOCUMENTS

| 2007/0138521 A1* | 6/2007 | Fukada | ................... H01L 28/56 257/532 |
|---|---|---|---|
| 2014/0042574 A1 | 2/2014 | Carman et al. | |

(Continued)

FOREIGN PATENT DOCUMENTS

| JP | 2001181094 A | * | 7/2001 | ............... H01B 3/12 |
|---|---|---|---|---|
| KR | 20220060446 A | * | 5/2022 | ........... H01L 27/088 |

OTHER PUBLICATIONS

Liu et al. "Role of Oxygen Vacancies in Electric Field Cycling Behaviors of Ferroelectric Hafnium Oxide." 2018 IEEE International Electron Devices Meeting (IEDM), published on Jan. 17, 2019.

*Primary Examiner* — Matthew E Warren
(74) *Attorney, Agent, or Firm* — Eschweiler & Potashnik, LLC

(57) ABSTRACT

In some embodiments, the present disclosure relates to a memory device including a semiconductor substrate, a first electrode disposed over the semiconductor substrate, a ferroelectric layer disposed between the first electrode and the semiconductor substrate, and a first stressor layer separating the first electrode from the ferroelectric layer. The first stressor layer has a coefficient of thermal expansion greater than that of the ferroelectric layer.

20 Claims, 21 Drawing Sheets

(56) References Cited

U.S. PATENT DOCUMENTS

| | | | |
|---|---|---|---|
| 2014/0070289 A1* | 3/2014 | Tanaka | H01L 27/1159 |
| | | | 257/295 |
| 2016/0005961 A1 | 1/2016 | Ino | |
| 2017/0294542 A1 | 10/2017 | Yamazaki et al. | |
| 2019/0207009 A1* | 7/2019 | Yamaguchi | H01L 29/6684 |
| 2020/0286985 A1* | 9/2020 | Lim | H01L 21/02197 |

* cited by examiner

US 11,737,280 B2

WAKEUP FREE APPROACH TO IMPROVE THE FERROELECTRICITY OF FERAM USING A STRESSOR LAYER

REFERENCE TO RELATED APPLICATION

This Application claims the benefit of U.S. Provisional Application No. 63/157,022, filed on Mar. 5, 2021, the contents of which are incorporated herein by reference in their entirety.

BACKGROUND

Many modern-day electronic devices include non-volatile memory. Non-volatile memory is electronic memory that is able to store data in the absence of power. A promising candidate for the next generation of non-volatile memory is ferroelectric random-access memory (FeRAM). FeRAM has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
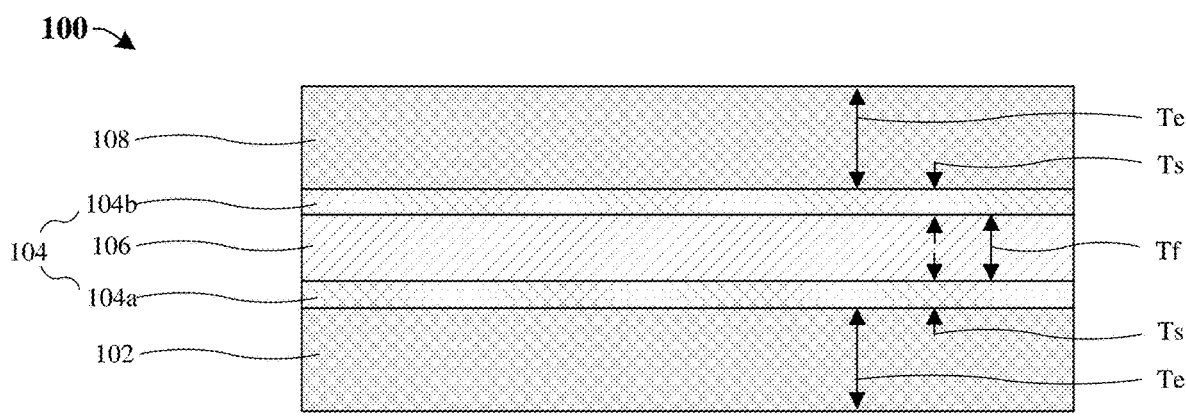
FIG. 1 illustrates a cross-sectional view of some embodiments of a ferroelectric memory structure comprising stressor layers.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Ferroelectric materials are commonly used in memory devices, such as ferroelectric random-access memory (FeRAM). Further, ferroelectric materials have a remanent polarization switchable between a first state and a second state by application of an electric field. Certain ferroelectric materials exhibit polycrystallinity that may determine remanent polarization behavior. Amongst these ferroelectric materials, three main crystalline phases are present: tetragonal, monoclinic, and orthorhombic. Further, amongst these three main crystalline phases, the orthorhombic phase exhibits remanent polarization. Hence, increasing the ratio of the orthorhombic phase to other phases may increase remanent polarization in the first and second states.

A ferroelectric memory structure may comprise an electrode and a pristine monoclinic phase ferroelectric layer (e.g., a monoclinic phase ferroelectric layer free of defects). By going through numerous wakeup cycles (e.g., read/write cycles) in a wakeup process, a number of defects (e.g., oxygen vacancies) increases. The increased defects increase the likelihood of monoclinic phase crystals converting to the orthorhombic phase and hence increase the remanent polarization of the ferroelectric layer. Further, by going through numerous wakeup cycles in the wakeup process, ferroelectric dipoles of o-phase crystals are aligned, increasing remanent polarization. However, the increased number of defects can lead to an increase in leakage current. In addition, the defects may be oxygen vacancies, which lead to oxygen ions when created. The oxygen ions may react with the electrode, causing a dead layer to accumulate between the electrode and the ferroelectric layer, which may impede a formation of orthorhombic phase crystals in the ferroelectric layer. The accumulation of the dead layer may also lead to a gradual decrease of remanent polarization known as fatigue. Thus, to sufficiently increase remanent polarization, the pristine ferroelectric memory structure goes through the numerous wakeup cycles of the wakeup phase to increase the number of defects. The increase in leakage current over the numerous wakeup cycles of the wakeup phase, in turn, may negatively impact endurance and retention of the ferroelectric memory structure.

In the present application, a ferroelectric memory structure comprises a ferroelectric layer separated from an electrode by a stressor layer. The stressor layer has a coefficient of thermal expansion that is greater than that of the ferroelectric layer. This allows the stressor layer to provide a tensile stress to the ferroelectric layer, thereby promoting formation of orthorhombic phase crystals in the ferroelectric layer. Further, the stressor layer may have an inertness to oxide formation greater than that of the electrode, which prevents an accumulation of a dead layer that impedes formation of orthorhombic phase crystals and leads to fatigue. Because the stressor layer is more inert to oxide formation than the electrode, reaction is reduced between the stressor layer and the oxygen ions created as a result of wakeup cycles, which means a dead layer is less likely to form. Thus, the inclusion of the stressor layer improves a remanent polarization of the ferroelectric memory structure in the first and second states. Further, since the ferroelectric memory structure goes through fewer wakeup cycles to reach a sufficient remanent polarization, fewer defects are formed, thus decreasing leakage current. Thus, the inclusion of the stressor layer in a ferroelectric memory structure improves ferroelectricity while mitigating the negative effects of going through numerous wakeup cycles in a wakeup phase, thereby positively impacting endurance and retention of the ferroelectric memory structure.

With reference to FIG. 1, a cross-sectional view 100 of some embodiments of a ferroelectric memory structure comprising stressor layers 104 is provided. The memory structure comprises a ferroelectric layer 106 vertically stacked between a bottom electrode 102 and a top electrode 108. A first stressor layer 104a vertically separates the bottom electrode 102 from the ferroelectric layer 106, and a second stressor layer 104b vertically separates the top electrode 108 from the ferroelectric layer 106. While the memory structure is illustrated with two stressor layers 104, a bottom electrode 102, and a top electrode 108, the memory structure may only have one stressor layer 104 and/or only one electrode in alternative embodiments. Further, the memory structure may have more than two stressor layers 104 and/or more than one ferroelectric layer 106 in alternative embodiments. In some embodiments, the ferroelectric memory structure may be employed as a ferroelectric capacitor.

The stressor layers 104 have a coefficient of thermal expansion (CTE) greater than that of the ferroelectric layer 106. For example, in embodiments in which the ferroelectric layer 106 is or comprises hafnium zirconium oxide, the stressor layers 104 may have a CTE greater than approximately $8.3 \times 10^{-6} \text{ k}^{-1}$ or some other suitable value. In some embodiments, the stressor layers 104 have a CTE of approximately $8.8 \times 10^{-6} \text{ k}^{-1}$. Other suitable values are, however, amenable. Hence, during operation, when the memory device heats up (or cools down), the stressor layers 104 apply tensile stress on the ferroelectric layer 106 and the ferroelectric layer 106 applies compressive stress on the stressor layers 104. In doing so, the stressor layers 104 change a b lattice constant of the ferroelectric layer 106, which distorts the crystalline lattice to promote a formation of orthorhombic phase crystals in the ferroelectric layer 106. In some embodiments, the stressor layers 104 have a greater CTE than that of the top electrode 108 and/or the bottom electrode 102. In further embodiments, the ferroelectric layer 106 also has a CTE greater than that of the top electrode 108 and/or the bottom electrode 102. In some embodiments, the stressor layers 104 apply tensile stress respectively on the bottom and top electrodes 102, 108 and the bottom and top electrodes 102, 108 apply compressive stress respectively on the stressor layers 104.

The ferroelectric layer 106 is polycrystalline and has a plurality of crystalline phases. The plurality of crystalline phases comprises the tetragonal phase, the monoclinic phase, and the orthorhombic phase. In some embodiments, the plurality of crystalline phases further comprises the cubic phase and/or some other suitable crystalline phase(s). Compared to the other phases, the orthorhombic phase exhibits remanent polarization. Further, formation of orthorhombic phase crystals in the ferroelectric layers 106 is promoted because of the tensile stress applied to the ferroelectric layer 106 by the stressor layers 104. Therefore, because the formation of the orthorhombic phase is promoted, the ferroelectric layer 106 has a greater remanent polarization than it would otherwise have without the stressor layers 104.

To increase a remanent polarization of the ferroelectric layer 106 without the stressor layers 104, the ferroelectric memory structure may undergo numerous wakeup cycles as part of a wakeup process to increase the remanent polarization. The wakeup cycles increase defects (e.g., oxygen vacancies) in the ferroelectric layer 106, which promote an increase in remanent polarization. However, absent the stressor layers 104, it takes many wakeup cycles to reach a sufficient remanent polarization, which leads to high leakage. Therefore, the stressor layers 104 allows a sufficient remanent polarization to be achieved without going through as many wakeup cycles, which leads to fewer defects and less leakage current.

Because the ferroelectric layer 106 has a remanent polarization, the ferroelectric memory structure has a remanent polarization. Further, by appropriately biasing the ferroelectric layer 106, the remanent polarization may be changed between a first state and a second state. For example, applying a first voltage having a positive polarity from the top electrode 108 to the bottom electrode 102 may set the first state. Further, applying a second voltage having a second polarity opposite the first polarity from the top electrode 108 to the bottom electrode 102 may set the second state.

Because the remanent polarization may be electrically measured, the remanent polarization may be employed to represent a bit of data. For example, the first state may represent a binary "1", whereas the second state may represent a binary "0", or vice versa. Further, the larger the difference (e.g., 2Pr) in remanent polarization between the first state and the second state, the larger the memory read window and hence the more resilient memory read operations are. Because it is the orthorhombic phase that exhibits remanent polarization, increasing the ratio of the orthorhombic phase to other phases may increase the polarization difference. Aside from the application of tensile stress, an increased thickness may also increase the orthorhombic phase ratio, and thus the polarization difference. Similarly, a smaller thickness may therefore decrease the polarization difference.

As described above, over time during operation of the memory device, the ferroelectric layer 106 produces oxygen vacancies (e.g., defects) and oxygen ions complementary to the defects. Absent the stressor layers 104, the oxygen ions may migrate to the bottom electrode 102 and/or the top electrode 108 and may react with the bottom and/or top electrode(s) 102, 108. Such reaction may lead to one or more dead layers. For example, a dead layer may form between the top electrode 108 and the ferroelectric layer 106 and/or a dead layer may form between the bottom electrode 102 and the ferroelectric layer 106. The presence of a dead layer decreases a thickness Tf of the ferroelectric layer 106, which, in turn, decreases the orthorhombic phase ratio and the remanent polarization. Further, a dead layer may increase in thickness over time, thereby leading to a gradual decrease of remanent polarization known as fatigue.

The first stressor layer 104a has a Gibbs free energy of oxide formation greater than that of the bottom electrode 102, and the second stressor layer 104b has a Gibbs free energy of oxide formation greater than that of the top electrode 108. For example, in at least some embodiments in which the bottom and top electrodes 102, 108 are or comprise tantalum nitride, the stressor layers 104 have a Gibbs free energy of oxide formation greater than −1900 kJ/mol or some other suitable value. In some embodiments, the Gibbs free energy of oxide formation may be referred to as inertness or inertness to oxide formation. By having a greater Gibbs free energy of oxide formation than the bottom electrode 102 and the top electrode 108, the stressor layers 104 are less likely to react with oxygen ions than the bottom and top electrodes 102, 108, whereby dead layers are less likely to form. Hence, the inertness of the stressor layers 104 may prevent or otherwise reduce a decrease in remanent polarization.

In some embodiments, the thickness Tf of the ferroelectric layer 106 may range from about 50-1000 Angstroms, about 50-500 Angstroms, about 250-750 Angstroms, about 500-1000 Angstroms, or some other suitable value. If the thickness Tf is too large (e.g., greater than about 1000 Angstroms), the ferroelectric layer 106 may become thermodynamically unstable in the orthorhombic crystalline phase, thereby decreasing remanent polarization. If the thickness Tf is too small (e.g., less than about 50 Angstroms), the ferroelectric layer 106 may provide an insufficient amount of remanent polarization to store data reliably.

In some embodiments, the stressor layers 104 have individual thicknesses Ts of about 5-100 Angstroms, 25-75 Angstroms, 50-100 Angstroms, or some other suitable value. If the thicknesses Ts are too large (e.g., greater than about 100 Angstroms), increased resistance of the stressor layers 104 may degrade power efficiency and shift operating parameters out of specification. If the thicknesses Ts are too small (e.g., less than about 5 Angstroms), the stressor layers 104 may not provide a sufficient tensile stress on the ferroelectric layer 106 and/or may not provide a sufficient inertness to oxide formation. In some embodiments, the first stressor layer 104a has the same thickness Ts as the second stressor layer 104b. In some embodiments, the bottom and top electrodes 102, 108 have individual thicknesses Te ranging from about 100-1000 Angstroms, about 100-500 Angstroms, about 250-750 Angstroms, about 500-1000 Angstroms, or some other suitable value. In some embodiments, the top electrode 108 has a same thickness Te as the bottom electrode 102.

In some embodiments, the ferroelectric layer 106 is or otherwise comprises hafnium zirconium oxide (e.g., HfZrO), hafnium oxide (e.g., $HfO_2$), zirconium oxide (e.g., $ZrO_2$), or some other suitable ferroelectric material(s). In some embodiments, the ferroelectric layers 106 are or comprise $Hf_xZr_{1-x}O_2$ with x ranging from 0 to 1. For example, the ferroelectric layers 106 may be or comprise $Hf_{0.5}Zr_{0.5}O_2$. In some embodiments, the ferroelectric layer 106 is or comprises a material with oxygen vacancies. In some embodiments, the stressor layers 104 are or otherwise comprise titanium, titanium oxide, platinum, scandium, yttrium, tungsten oxide, nickel, cobalt, gold, tin, tin oxide, aluminum, aluminum oxide, thallium, zinc, zinc oxide, indium, molybdenum, or some other suitable material(s). In some embodiments, the first stressor layer 104a comprises the same material as the second stressor layer 104b. In some embodiments, the top electrode 108 and the bottom electrode 102 are or comprise tungsten, tantalum nitride, ruthenium, platinum, iridium, molybdenum, or some other suitable material(s).

Figure 2A:
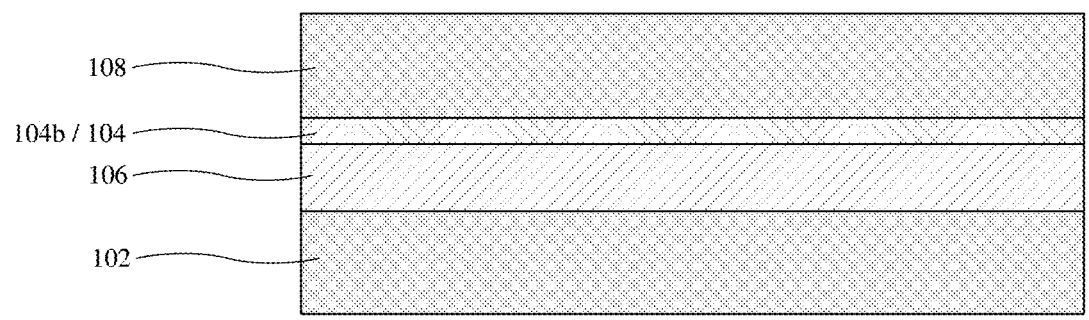
FIGS. 2A-2C illustrate cross-sectional views of some alternative embodiments of the ferroelectric memory structure of FIG. 1.
Figure 2B:
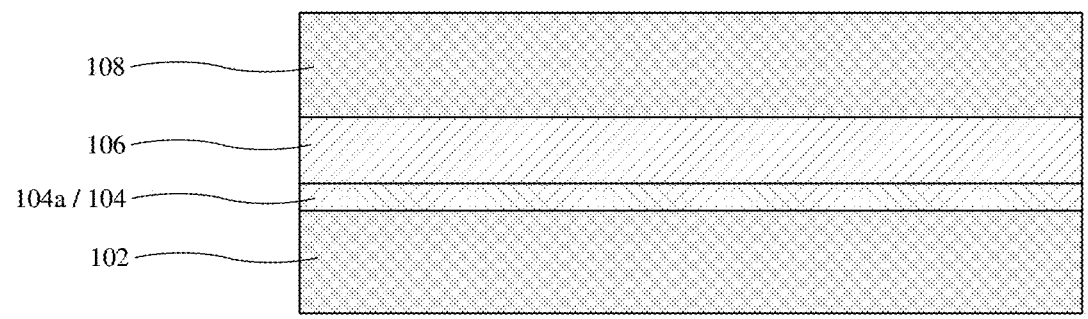
Figure 2C:
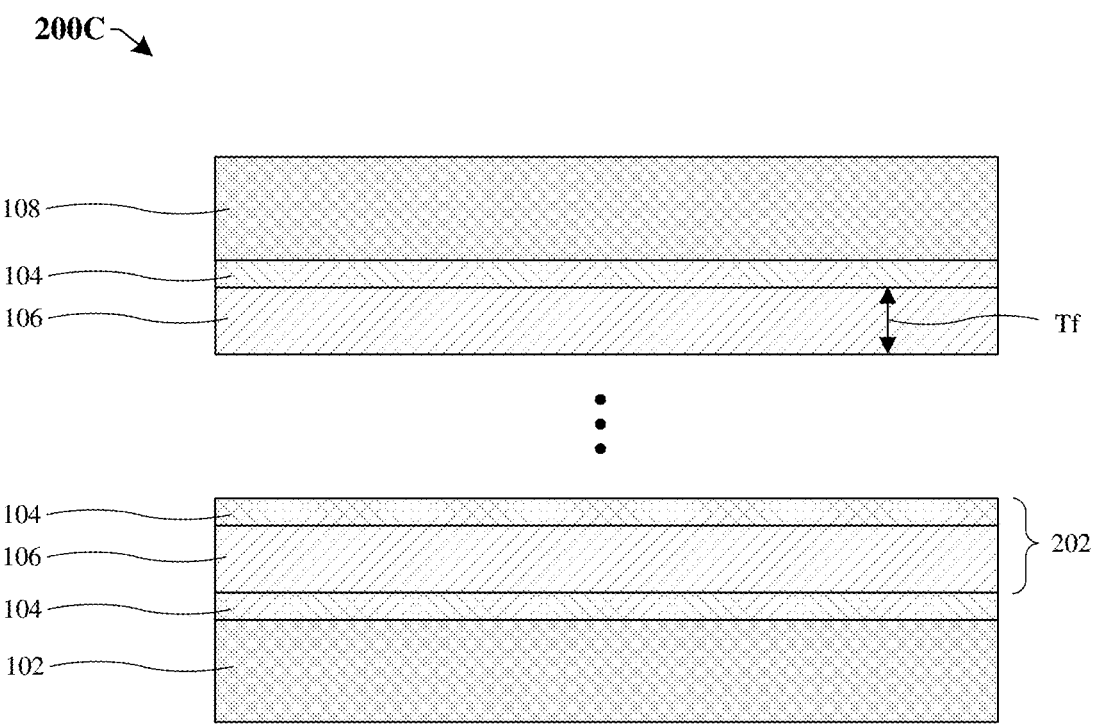

With reference to FIGS. 2A-2C, cross-sectional views 200A-200C of some alternative embodiments of the ferroelectric memory structure of FIG. 1 are provided.

In the cross-sectional view 200A of FIG. 2A, the first stressor layer 104a is omitted. This saves material costs at the expense of remanent polarization. Particularly, without the first stressor layer 104a, less tensile stress is applied to the ferroelectric layer 106, whereby the orthorhombic phase is reduced and hence the remanent polarization is reduced.

In the cross-sectional view 200B of FIG. 2B, the second stressor layer 104b is omitted. As in FIG. 2A, this saves material costs at the expense of remanent polarization.

In the cross-sectional view 200C of FIG. 2C, the memory device comprises a plurality of stressor layers 104 alternatingly stacked with a plurality of ferroelectric layers 106 between a bottom electrode 102 and a top electrode 108. In some embodiments, a stressor layer 104 separates the plurality of ferroelectric layers 106 from the top electrode 108. In some embodiments, a stressor layer 104 separates the plurality of ferroelectric layers 106 from the bottom electrode 102. The ellipsis is used to represent zero, one, two, or more additional ferroelectric-layer-stressor-layer pairs 202. The plurality of stressor layers 104 provide a tensile stress to the plurality of ferroelectric layers 106 to promote formation of orthorhombic phase crystals in the ferroelectric layer 106.

Thickness of the ferroelectric layers 106 may be used to increase the polarization difference. However, the orthorhombic phase becomes thermodynamically unstable when the individual thicknesses Tf of the ferroelectric layers 106 are too large, such that the ferroelectric layers 106 lose remanent polarization or have low remanent polarizations. In some embodiments, a collective thickness of the ferroelectric layers 106 may be in excess of the individual thicknesses Tf without causing thermodynamic instability and losing remanent polarization. Thus, as more ferroelectric layers 106 are stacked between the top electrode 108 and the bottom electrode 102, the remanent polarization may increase.

Figure 3:
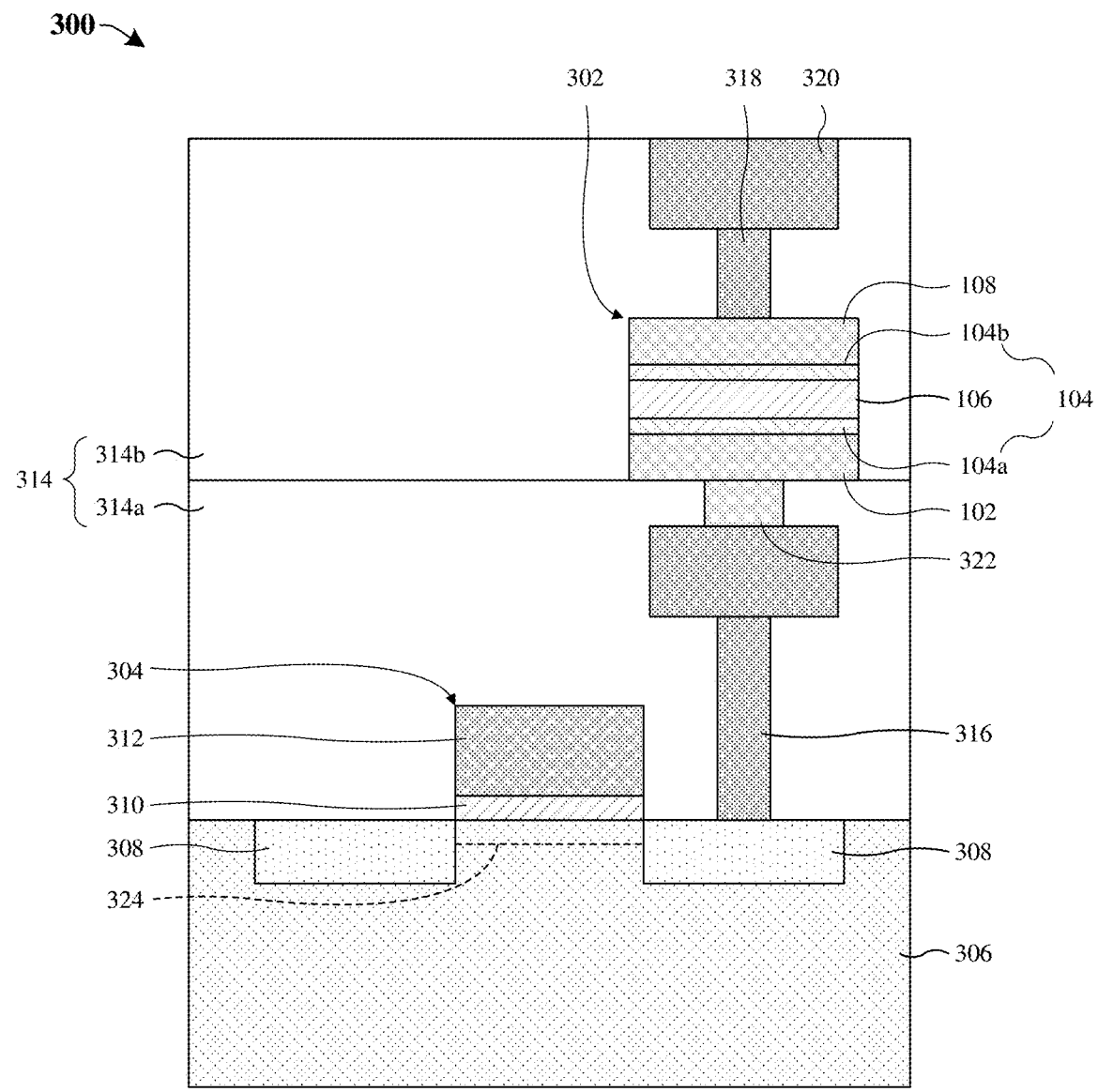
FIG. 3 illustrates a cross-sectional view of some embodiments of a one-transistor-one-capacitor (1T1C) ferroelectric memory device comprising the ferroelectric memory structure of FIG. 1.

With reference to FIG. 3, a cross-sectional view 300 of some embodiments of a one-transistor-one-capacitor (1T1C) ferroelectric memory device comprising the ferroelectric memory structure of FIG. 1 is provided.

A ferroelectric memory structure 302 overlies and is electrically coupled to an access device 304. In some embodiments, the ferroelectric memory structure 302 may be the memory device of FIG. 1. The access device 304 is on and partially formed in a semiconductor substrate 306. Further, the access device 304 comprises a pair of source/drain regions 308, a gate dielectric layer 310, and a gate electrode 312. The pair of source/drain regions 308 are embedded in a top of the semiconductor substrate 306, and the gate dielectric layer 310 and the gate electrode 312 are stacked laterally between the source/drain regions 308. In some embodiments, the access device 304 is a planar field-effect transistor (FET), a fin FET (FinFET), a gate-all-around (GAA) FET, or some other suitable type of semiconductor device.

An interconnect structure overlies the semiconductor substrate 306 and electrically couples to the ferroelectric memory structure 302 and the access device 304. The interconnect structure comprises a contact via 316, an interlevel via 318, and a plurality of wires 320 in an interconnect dielectric structure 314. The contact via 316 extends from a bottom one of the wires 320 to one of the source/drain regions 308. Further, a bottom electrode via (BEVA) 322 is at a bottom of the ferroelectric memory structure 302 and extends from the bottom electrode 102 to the bottom one of the wires 320. In some embodiments, the BEVA 322 is integrated with the bottom electrode 102. In alternative embodiments, the BEVA 322 is independent of the bottom electrode 102. The interlevel via 318 overlies the ferroelectric memory structure 302 and extends from a top one of the wires 320 to the ferroelectric memory structure 302. In some embodiments, the interlevel via 318 electrically couples the top electrode 108 to the top one of the wires 320. In some embodiments, the interconnect dielectric structure 314 comprises a lower interconnect dielectric layer 314a and an upper interconnect dielectric layer 314b.

During operation, a bit of data is stored in the ferroelectric memory structure 302 using the remanent polarization of the ferroelectric layer 106 to represent the bit. To write, the gate electrode 312 is biased so a channel region 324 underlying the gate electrode 312 conducts and electrically connects the source/drain regions 308. A set voltage or a reset voltage is then applied across the ferroelectric memory structure 302 through the channel region 324 of the access device 304 to set the remanent polarization respectively to a first state or a second state. To read, the gate electrode 312 is again biased so the channel region 324 electrically connects the source/drain regions 308. The set or reset voltage is then applied across the ferroelectric memory structure 302 through the channel region 324 of the access device 304. If the state of the remanent polarization changes, a current pulse occurs, and if not, then no current pulse occurs. Thus, the current pulse is used to read the state of the remanent polarization.

In some embodiments, the semiconductor substrate 306 is a bulk substrate of silicon, an SOI substrate, or some other suitable semiconductor substrate. In some embodiments, the source/drain regions 308 are doped regions of the semiconductor substrate 306. In other embodiments, the source/drain regions 308 are independent of the semiconductor substrate 306 and overlie a top surface of the semiconductor substrate 306. In some embodiments, the gate electrode 312 is or comprises doped polysilicon, metal, some other suitable conductive material, or any combination of the foregoing. In some embodiments, the gate dielectric layer 310 is or comprises silicon oxide and/or some other suitable dielectric. In some embodiments, the wires 320, the interlevel via 318, the contact via 316, and the BEVA 322 are or comprise metal and/or some other suitable conductive material. In some embodiments, the interconnect dielectric structure 314 is or comprise a dielectric oxide and/or some other suitable dielectric material(s).

While the ferroelectric memory structure 302 is illustrated as in FIG. 1, the ferroelectric memory structure 302 may be as any of the memory devices of FIGS. 2A-2C. While the ferroelectric memory structure 302 is described as part of a 1T1C memory structure, the ferroelectric memory structure 302 may alternatively be part of a two-transistor two-capacitor (2T2C) memory structure in alternative embodiments.

Figure 4:
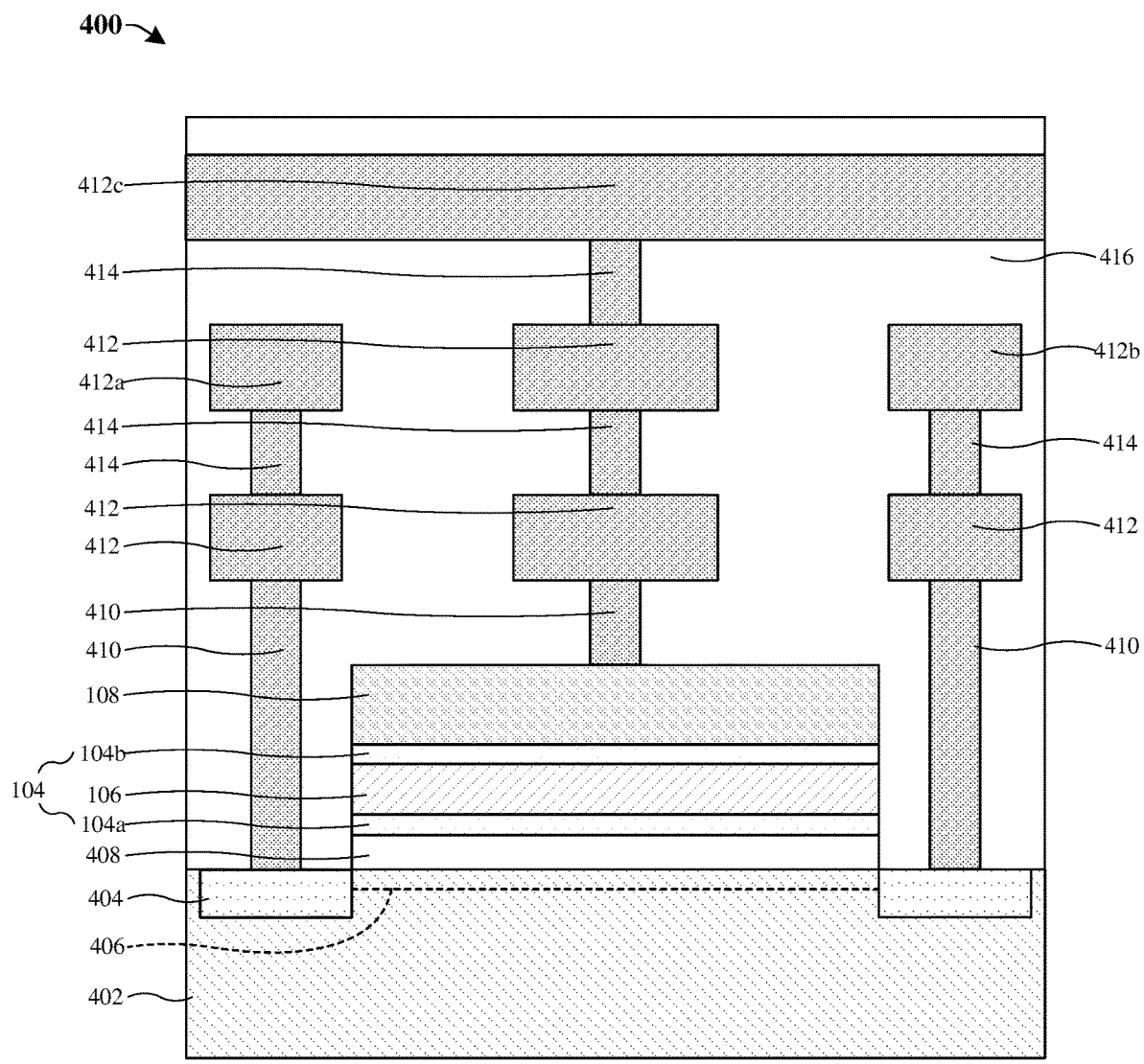
FIG. 4 illustrates a cross-sectional view of some embodiments of a one transistor (1T) ferroelectric memory device comprising a stressor layer.

With reference to FIG. 4, a cross-sectional view 400 of some embodiments of a one transistor (1T) ferroelectric memory device comprising a stressor layer is provided. In some embodiments, the 1T ferroelectric memory device may also be regarded as a ferroelectric field-effector transistor (FeFET). A semiconductor substrate 402 underlies stressor layers 104, and a ferroelectric layer 106 separates the first stressor layer 104a from the second stressor layer 104b. A top electrode 108 overlies the stressor layers 104 such that the second stressor layer 104b separates the top electrode 108 from the ferroelectric layer 106. In some embodiments, the stressor layers 104 are conductive and the first stressor layer 104a is separated from the semiconductor substrate 402 by a gate dielectric layer 408. In some embodiments, the top electrode 108, the stressor layers 104, and the ferroelectric layer 106 may be as described in FIG. 1.

A pair of source/drain regions 404 are embedded in a top of the semiconductor substrate 402, respectively on opposite sides of the ferroelectric layer 106. Further, a channel region 406 extends between the pair of source/drain regions 404, along the top of the semiconductor substrate 402, and directly underlying the ferroelectric layer 106. The channel region 406 selectively conducts depending on a voltage from the top electrode 108 to a source one of the pair of source/drain regions 404. For example, the channel region 406 may conduct when the voltage is more than a threshold voltage and may not conduct when the voltage is less than the threshold voltage, or vice versa. In some embodiments, the pair of source/drain regions 404 are doped regions of the semiconductor substrate 402. In other embodiments, the pair of source/drain regions 404 are independent of and are inset into a top of the semiconductor substrate 402. The stressor layer 104 is configured to provide the ferroelectric layer 106 with a tensile stress to promote ferroelectric behavior. Further, the stressor layers 104 are configured to inhibit a dead layer and/or leakage current.

An interconnect dielectric layer 416 is disposed over the semiconductor substrate 402. A plurality of contact vias 410 extend through the interconnect dielectric layer 416 to contact the pair of source/drain regions 404 and the top electrode 108, respectively. In some embodiments, a plurality of wires 412 (e.g., metal lines) and a plurality of interlevel vias 414 are disposed in the interconnect dielectric layer 416. The plurality of wires 412, the plurality of interlevel vias 414, and the plurality of contact vias 410 are electrically coupled together and are configured to provide electrical connections between various devices disposed throughout the memory device. It will be appreciated that any number of wires 412 and/or interlevel vias 414 may be alternately stacked in the interconnect dielectric layer 416. In yet further embodiments, the plurality of contact vias 410, the plurality of wires 412, and the plurality of interlevel vias 414 may be referred to as an interconnect structure.

A first one of the plurality of wires 412 is denoted as 412a and may be referred to as a bit line. In further embodiments, the bit line 412a may be electrically coupled to a first source/drain region of the pair of source/drain regions 404 via the interconnect structure. A second one of the plurality of wires 412 is denoted as 412b and may be referred to as a source line. In yet further embodiments, the source line 412b may be electrically coupled to a second source/drain region of the pair of source/drain regions 404 via the interconnect structure. A third one of the plurality of wires 412 is denoted as 412c and may be referred to as a word line. In some embodiments, the word line 412c may be electrically coupled to the top electrode 108 via the interconnect structure.

During operation of the memory device, the remanent polarization of the ferroelectric layer 106 is employed to represent a bit of data. To write, a set voltage or a reset voltage is applied from the top electrode 108 to the channel region 406. The set voltage sets the remanent polarization of the ferroelectric layer 106 to the first state, whereas the reset voltage sets the remanent polarization to second state. The threshold voltage varies with the state of the remanent polarization. To read, a read voltage between the different threshold voltage states is applied from the top electrode 108 to the source one of the pair of source/drain regions 404. Depending on whether the channel region 406 conducts, the remanent polarization is in the first or second state.

In some embodiments, the semiconductor substrate 402 is or comprises amorphous Indium-Gallium-Zinc-Oxide (a-IGZO), silicon, silicon germanium, a group III-V material, a group II-VI material, some other suitable semiconductor material, or any combination of the foregoing. The group III-V material may, for example, be or comprise gallium arsenide (e.g., GaAs), gallium arsenide indium (e.g., GaAsIn), or some other suitable group III-V material. The group II-VI material may, for example, be or comprise zinc oxide (e.g., ZnO), magnesium oxide (e.g., MgO), gadolinium oxide (e.g., GdO), or some other suitable II-VI material. In some embodiments, the gate dielectric layer 408 is or comprises silicon dioxide and/or some other suitable dielectric. In some embodiments, the plurality of wires 412 and the plurality of interlevel vias 414 may, for example, be or comprise copper, aluminum, titanium nitride, tantalum nitride, ruthenium, tungsten, another suitable conductive material, or any combination of the foregoing. In some embodiments, the contact vias 410 may, for example, be or comprise tungsten, copper, aluminum, ruthenium, another suitable conductive material, or any combination of the foregoing. In some embodiments, the interconnect dielectric layer 416 may, for example, be or comprise a low-k dielectric (e.g., a dielectric material with a dielectric constant less than about 3.9), an oxide (e.g., silicon dioxide (e.g., $SiO_2$)), another suitable dielectric material, or any combination of the foregoing.

Figure 5:
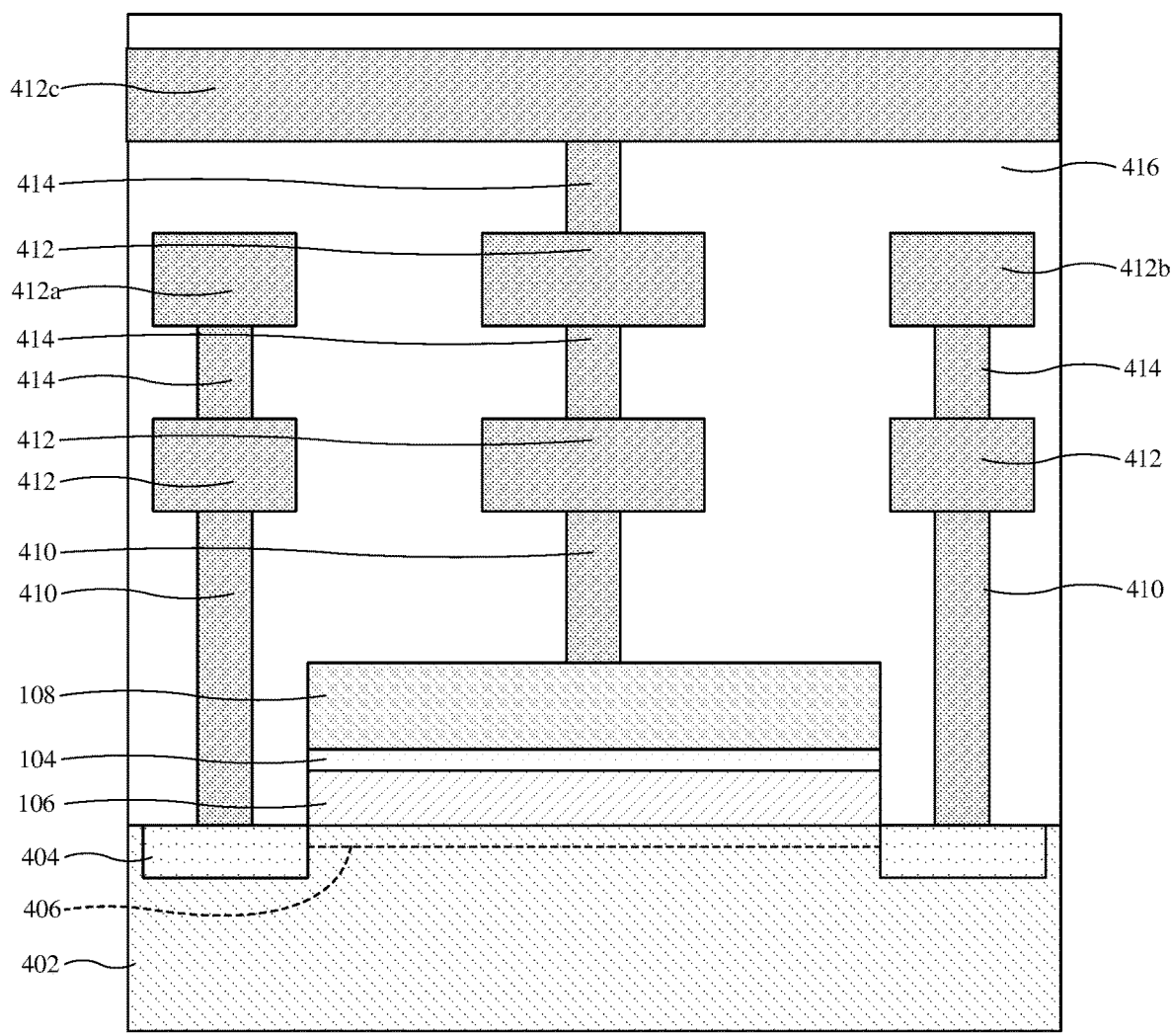
FIG. 5 illustrates a cross-sectional view of some alternative embodiments of the 1T ferroelectric memory device of FIG. 4.

With reference to FIG. 5, a cross-sectional view 500 of some alternative embodiments of the 1T ferroelectric memory device of FIG. 4 is provided. The first stressor layer 104a and/or the gate dielectric layer 408 is/are omitted. This saves material costs at the expense of remanent polarization. Particularly, without the first stressor layer 104a, less tensile stress is applied to the ferroelectric layer 106, whereby the orthorhombic phase is reduced and hence the remanent polarization is reduced.

Figure 6:
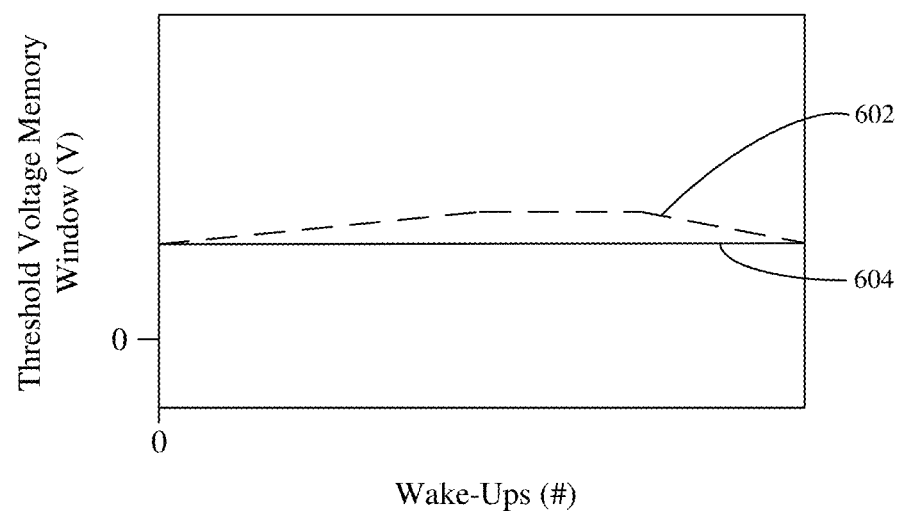
FIG. 6 illustrates a graph of some embodiments of a relationship between a memory window and a number of wake-up cycles over a lifetime of a ferroelectric memory device comprising a stressor layer.

FIG. 6 illustrates a graph 600 of some embodiments of a relationship between a memory window and a number of wake-up cycles over a lifetime of a ferroelectric memory device comprising a stressor layer. The ferroelectric memory device may be, for example, the memory device of FIG. 4.

A first line 602 represents a small sized FeFET device, and a second line 604 represents a medium sized FeFET device. In some embodiments, the medium sized FeFET device may be approximately four times larger than the small sized FeFET device. As a number of wake-up phases increases, a memory window remains largely constant. While the first line 602 has a memory window that both increases and decreases as the number of wake-up phases increases, both the small and medium sized FeFET devices have a memory window that returns to its starting point over the life of the device. Because the inclusion of the stressor layer provides a tensile stress to a ferroelectric layer and further inhibits formation of a dead layer, both the small and medium sized FeFET device have a greater pristine remanent polarization, and do not increase the memory window over many wakeup cycles. Hence, the FeFET devices avoid the negative effects of the wake-up phase and fatigue, allowing the FeFET devices to have greater endurance and retention performance.

Figure 7:
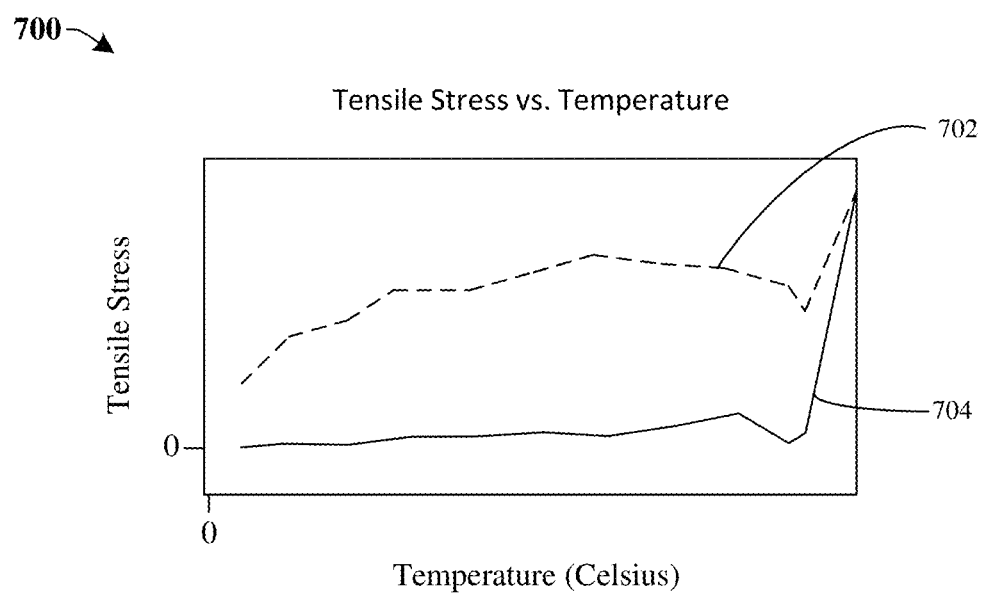
FIG. 7 illustrates a graph of some embodiments of a relationship between tensile stress and temperature for a ferroelectric memory device comprising a stressor layer.

FIG. 7 illustrates a graph 700 of some embodiments of a relationship between tensile stress and temperature of a ferroelectric memory device comprising a stressor layer. The ferroelectric memory device may be, for example, the ferroelectric memory structure of FIG. 1.

A first line 702 represents the ferroelectric memory device undergoing cooling, and a second line 704 represents the ferroelectric memory device undergoing heating. At temperatures ranging from 0-400 degrees Celsius, the first line 702 has a tensile stress greater than zero, meaning that during cooling, the stressor layer acts as a tensile stressor and provides a tensile stress on the ferroelectric layer. The second line 704 also has a tensile stress greater than zero for temperatures ranging from 0-400 degrees Celsius, meaning that during heating, the stressor layer acts as a tensile stressor and provides a tensile stress on the ferroelectric layer. In some embodiments, below a temperature of 400 degrees Celsius, the tensile stress during heating is below that during cooling. In some embodiments, above or equal to a temperature of 400 degrees (not shown), the tensile stress during heating is above that during cooling. The absence of a stressor layer may lead to a negative tensile stress at temperatures ranging from 0-400 degrees for both heating and cooling (not shown). Because the inclusion of the stressor layer provides a tensile stress to a ferroelectric layer, the ferroelectric memory device has a greater pristine remanent polarization.

With reference to FIGS. 8-15 a series of cross-sectional views 800-1500 of some embodiments of a method for forming a 1T1C ferroelectric memory device comprising stressor layers is provided. The memory device may, for example, be as described with regard to FIG. 3. Although FIGS. 8-15 are described in relation to a method, it will be appreciated that the structures disclosed in FIGS. 8-15 are not limited to such a method, but instead may stand alone as structures independent of the method.

Figure 8:
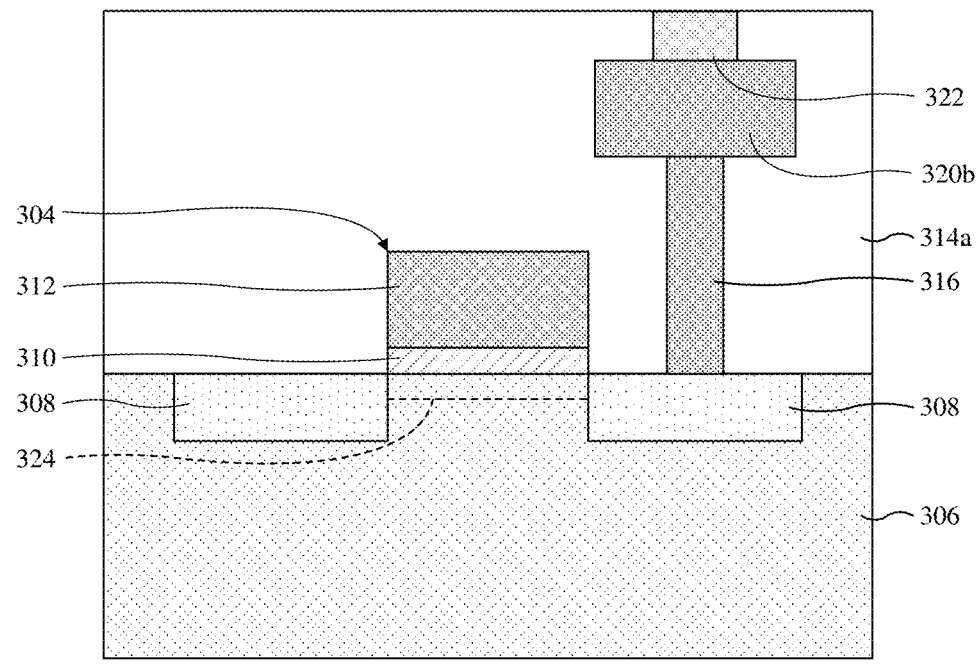
FIGS. 8-15 illustrate a series of cross-sectional views of some embodiments of a method for forming a 1T1C ferroelectric memory device comprising stressor layers.

As illustrated by the cross-sectional view 800 of FIG. 8, an access device 304 is formed on a semiconductor substrate 306. The access device 304 comprises a pair of source/drain regions 308, a gate dielectric layer 310, and a gate electrode 312. A lower interconnect dielectric layer 314a is formed over the access device 304. Further, a lower interconnect structure is formed in the lower interconnect dielectric layer 314a. The lower interconnect structure comprises a contact via 316, a bottom wire 320b overlying the contact via 316, and a bottom electrode via (BEVA) 322 overlying the bottom wire 320b.

Figure 9:
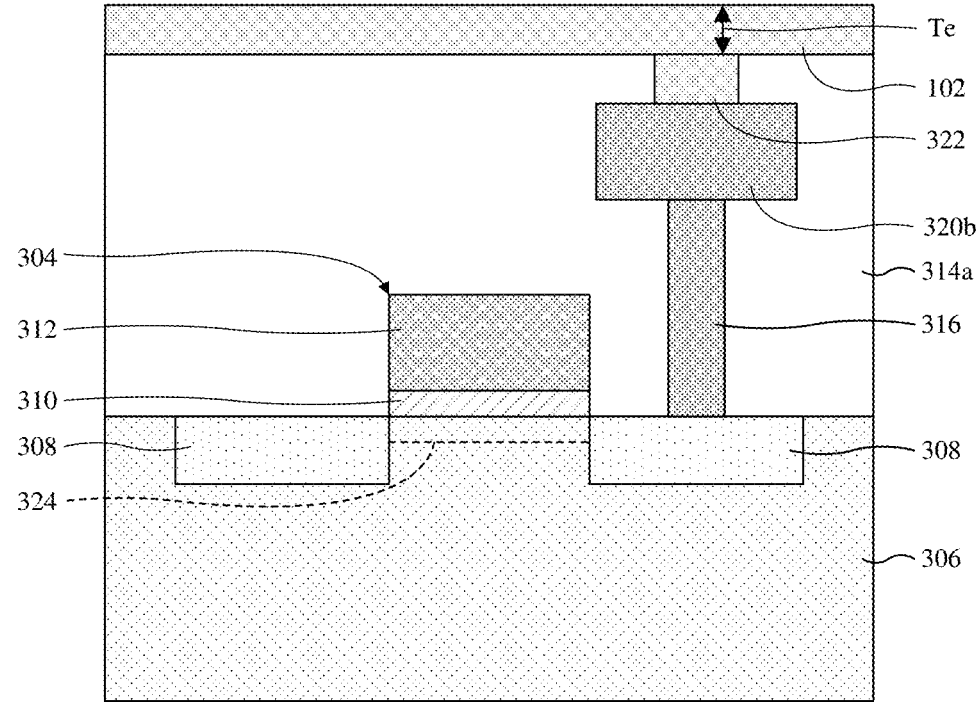

As illustrated by the cross-sectional view 900 of FIG. 9, a bottom electrode 102 is formed over the BEVA 322. The bottom electrode 102 has a thickness Te ranging from about 100-1000 Angstroms, about 100-500 Angstroms, about 250-750 Angstroms, about 500-1000 Angstroms, or some other suitable value. A process for forming the bottom electrode 102 may be or comprise depositing the bottom electrode 102 by direct current (DC) sputtering, physical vapor deposition (PVD), chemical vapor deposition (CVD), atomic layer deposition (ALD), some other suitable deposition process, or any combination of the foregoing. In some embodiments, the bottom electrode 102 is as described with regard to FIG. 1.

Figure 10:
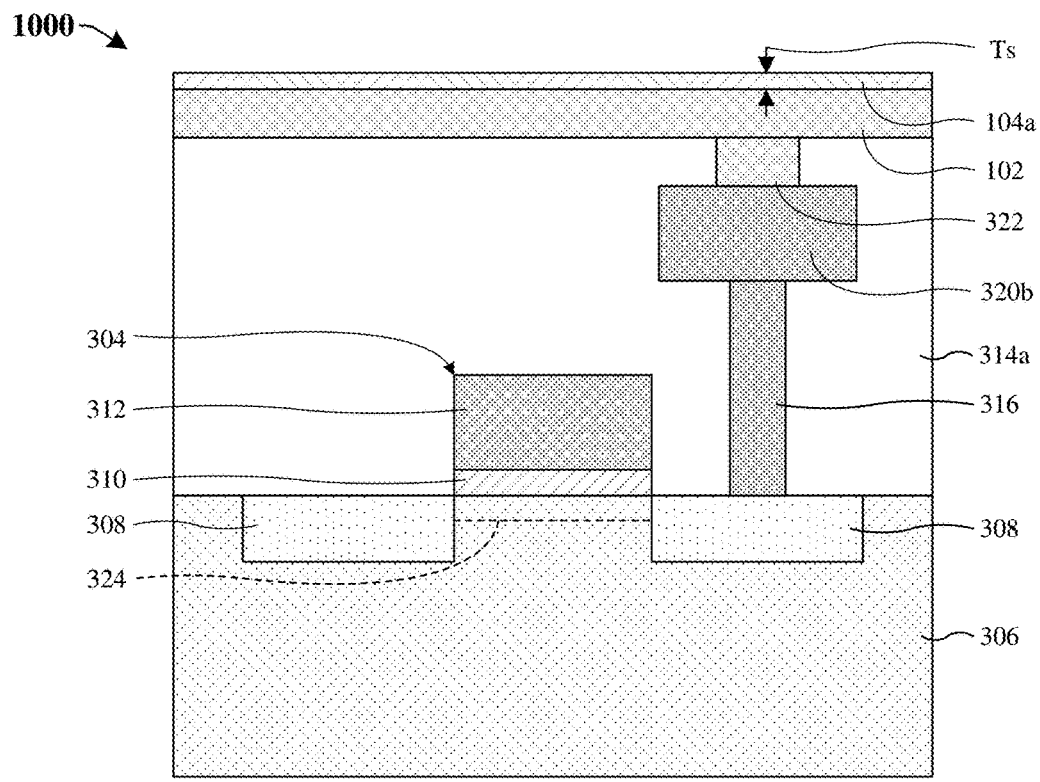

As illustrated by the cross-sectional view 1000 of FIG. 10, a first stressor layer 104a is formed over the bottom electrode 102. A process for forming the first stressor layer 104a may be or comprise depositing the first stressor layer 104a by DC sputtering, PVD, CVD, ALD, some other suitable deposition process, or any combination of the foregoing. The first stressor layer 104a has a Gibbs free energy of oxide formation greater than that of the bottom electrode 102. In some embodiments, the first stressor layer 104a has a thickness Ts of about 5-100 Angstroms, 25-75 Angstroms, 50-100 Angstroms, or some other suitable value. In some embodiments, the first stressor layer 104a is as described with regard to FIG. 1.

Figure 11:
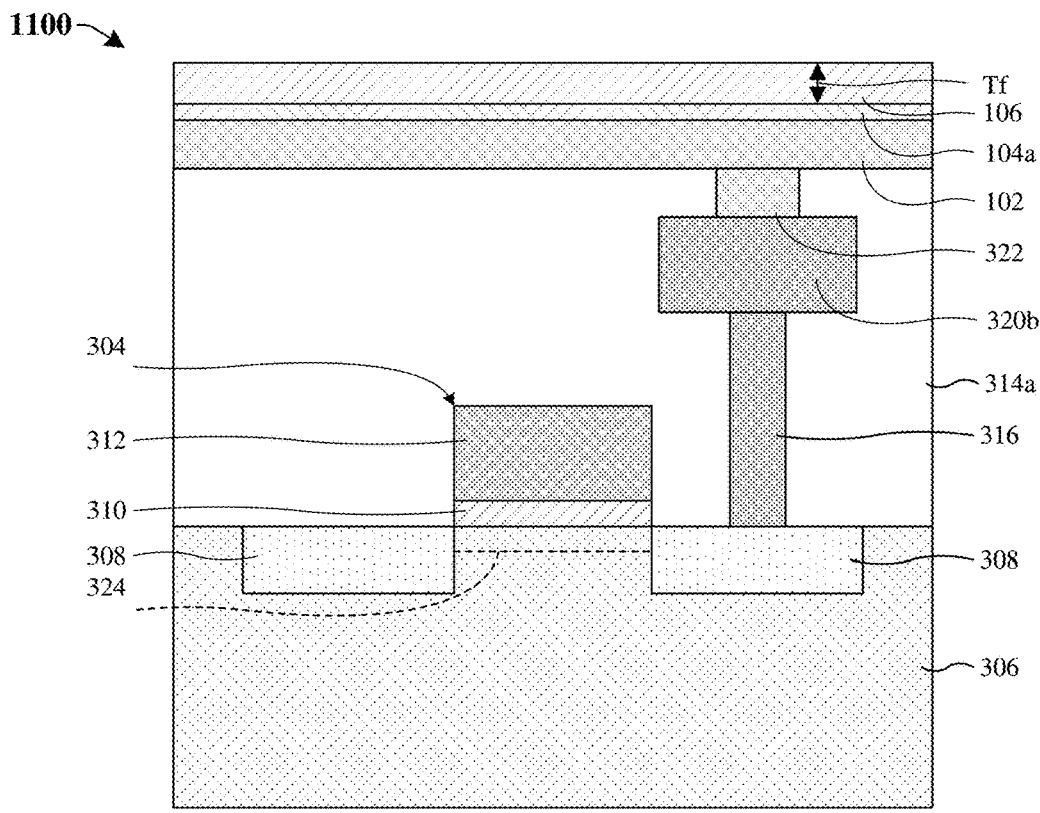

As illustrated by the cross-sectional view 1100 of FIG. 11, a ferroelectric layer 106 is formed over the first stressor layer 104a. The ferroelectric layer 106 is polycrystalline and has a plurality of crystalline phases. Further, the ferroelectric layer 106 has a remanent polarization. The ferroelectric layer 106 has a CTE less than that of the first stressor layer 104a. The ferroelectric layer 106 has a thickness Tf that may range from about 50-1000 Angstroms, about 50-500 Angstroms, about 250-750 Angstroms, about 500-1000 Angstroms, or some other suitable value. In some first embodiments, a process for forming the ferroelectric layer 106 comprises depositing the ferroelectric layer 106 as an amorphous layer and then crystallizing the ferroelectric layer 106 with a thermal anneal. The thermal anneal may, for example, be performed at about 300-800 degrees Celsius or some other suitable temperature. In some second embodiments, the process for forming the ferroelectric layer 106 comprises depositing the ferroelectric layer 106 crystallized. The depositing for the first and/or second embodiments may, for example, be or comprise ALD and/or some other suitable deposition process. The ALD may, for example, be performed at or above about 300 degrees Celsius or at some other suitable temperature. In some embodiments, the ferroelectric layer 106 is as described in FIG. 1.

Figure 12:
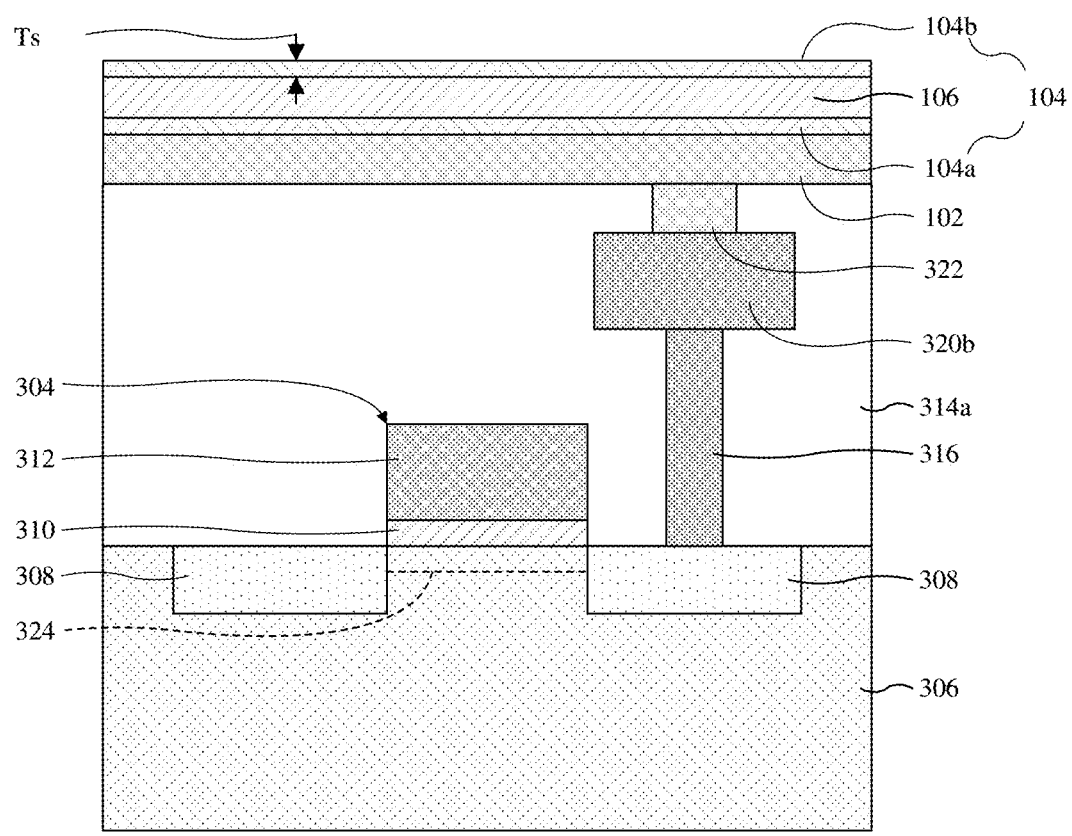

As illustrated by the cross-sectional view 1200 of FIG. 12, a second stressor layer 104b is formed over the ferroelectric layer 106. A process for forming the second stressor layer 104b may be or comprise depositing the second stressor layer 104b by DC sputtering, PVD, CVD, ALD, some other suitable deposition process, or any combination of the foregoing. The second stressor layer 104b has a CTE greater than that of the ferroelectric layer 106. In some embodiments, the second stressor layer 104b has the thickness Ts. In some embodiments, the second stressor layer 104b is as described with regard to FIG. 1.

Figure 13:
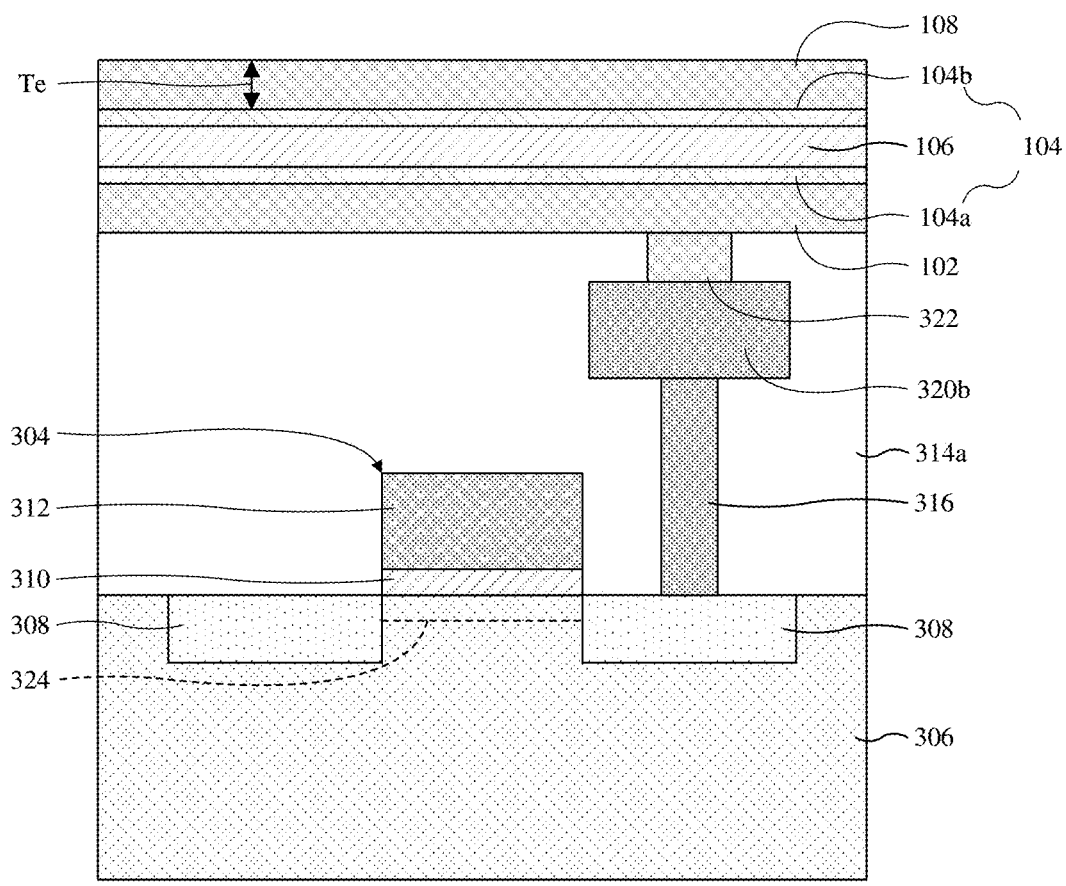

As illustrated by the cross-sectional view 1300 of FIG. 13, a top electrode 108 is formed over the second stressor layer 104b. The top electrode 108 has a Gibbs free energy of oxide formation less than that of the second stressor layer 104b. A process for forming the top electrode 108 may be or comprise depositing the top electrode 108 by DC sputtering, PVD, CVD, ALD, some other suitable deposition process, or any combination of the foregoing. Further, the process may, for example, comprise annealing. The annealing may, for example, be performed at about 400-900 degrees Celsius to reduce stress and/or enhance crystallinity of the ferroelectric layers 106. Further, the annealing may, for example, be performed in an atmosphere comprising nitrogen gas (e.g., $N_2$), argon gas, oxygen gas (e.g., $O_2$), some other suitable gas, or any combination of the foregoing. In some embodiments, the top electrode has the thickness Te. In some embodiments, the top electrode 108 is as described with regard to FIG. 1.

Because the stressor layers 104 have greater CTEs than the ferroelectric layer 106, the stressor layers 104 apply tensile stress on the ferroelectric layer 106. This promotes a formation of orthorhombic phase crystals in the ferroelectric layer 106, which, in turn, increases the remanent polarization of the ferroelectric layer 106. Because the stressor layers 104 increase remanent polarization, fewer wakeup cycles may be employed. This leads to fewer defects (e.g., oxygen vacancies) in the ferroelectric layer 106, which reduces leakage current. Further, because the stressor layers 104 are more inert to oxide formation than the top electrode 108 and the bottom electrode 102, oxidation at the top and bottom of the ferroelectric layer 106 is less layer and accumulation of dead layer(s) separating the ferroelectric layer 106 from the bottom electrode 102 and/or the top electrode 108 is less likely.

Figure 14:
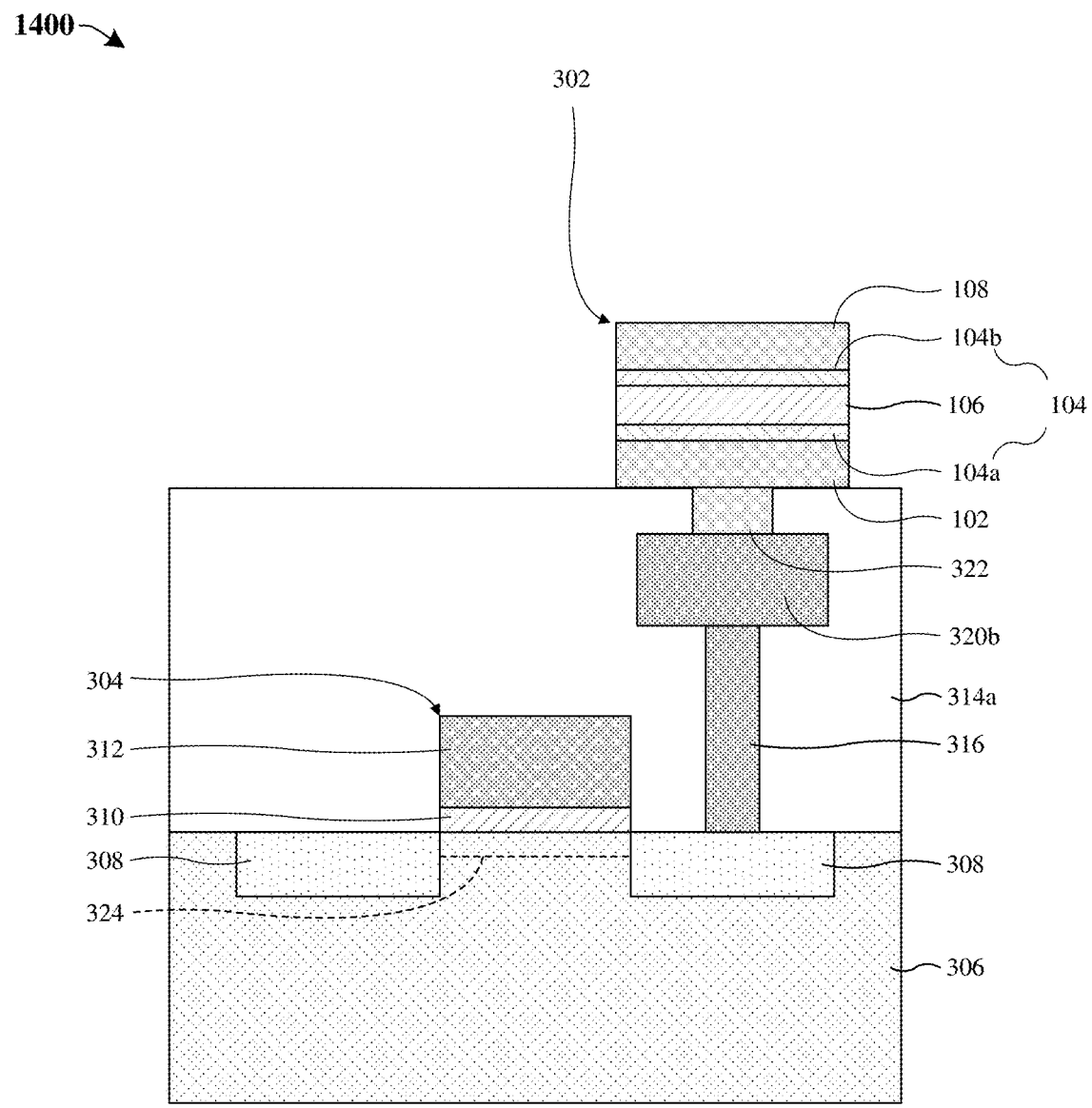

As illustrated by the cross-sectional view 1400 of FIG. 14, the bottom electrode 102, the first stressor layer 104a, the ferroelectric layer 106, the second stressor layer 104b, and the top electrode 108 are patterned to define a ferroelectric memory structure 302. The patterning may, for example, be performed by a photolithography/etching process and/or by some other suitable process. In some embodiments, the patterning comprises: forming a hard mask (not shown) over the top electrode 108 using a photolithography/etching process; and subsequently etching the bottom electrode 102, the first stressor layer 104a, the ferroelectric layer 106, the second stressor layer 104b, and the top electrode 108 with the hard mask in place.

Figure 15:
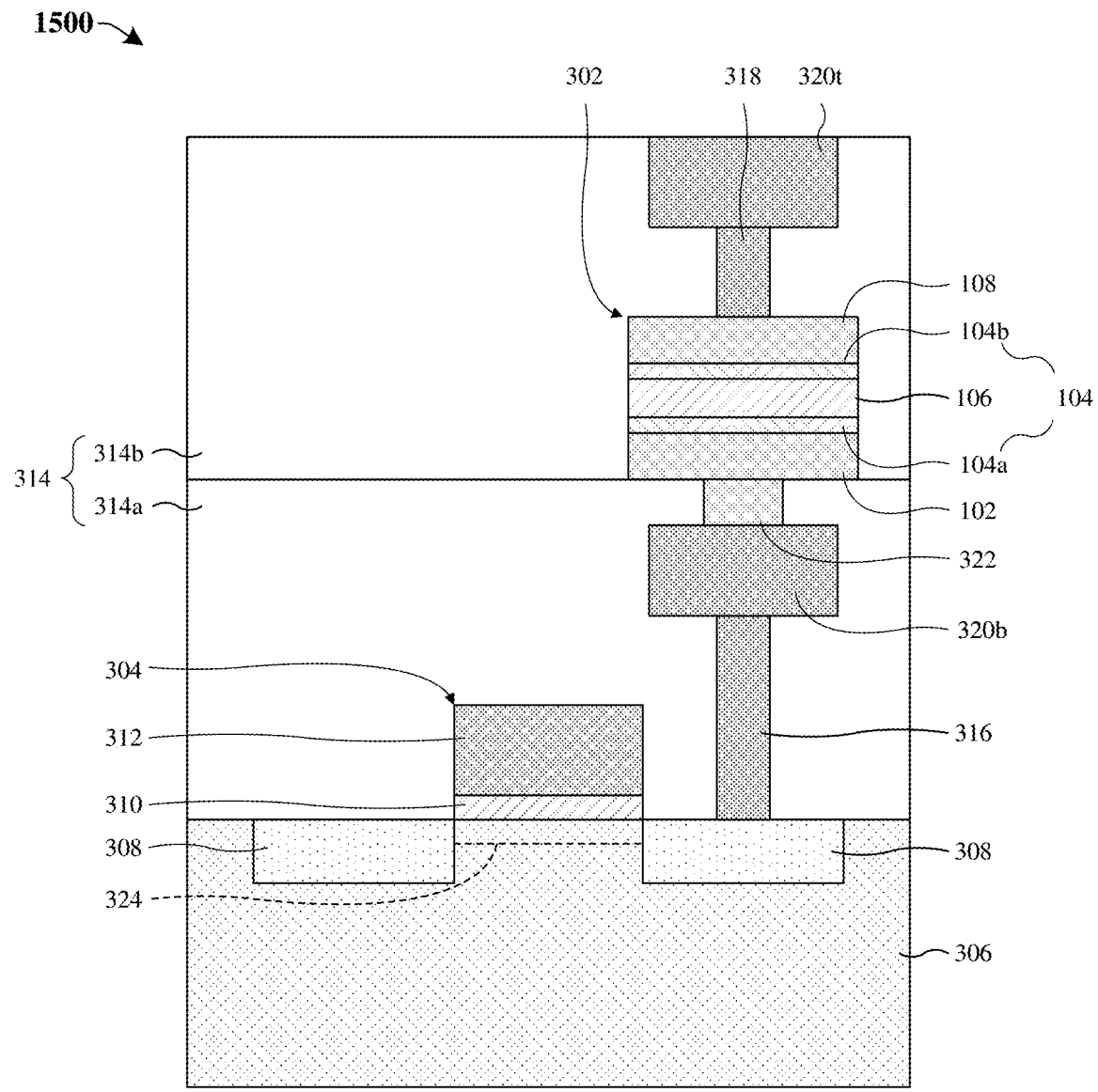

As illustrated by the cross-sectional view 1500 of FIG. 15, an upper interconnect dielectric layer 314b is formed over the lower interconnect dielectric layer 314a, such that the upper interconnect dielectric layer 314b and the lower interconnect dielectric layer 314a form an interconnect dielectric structure 314. Further, an upper interconnect structure is formed in the upper interconnect dielectric layer 314b. The upper interconnect structure comprises an interlevel via 318 overlying the memory structure 302 and further comprises a top wire 320t overlying the interlevel via 318.

Figure 16:
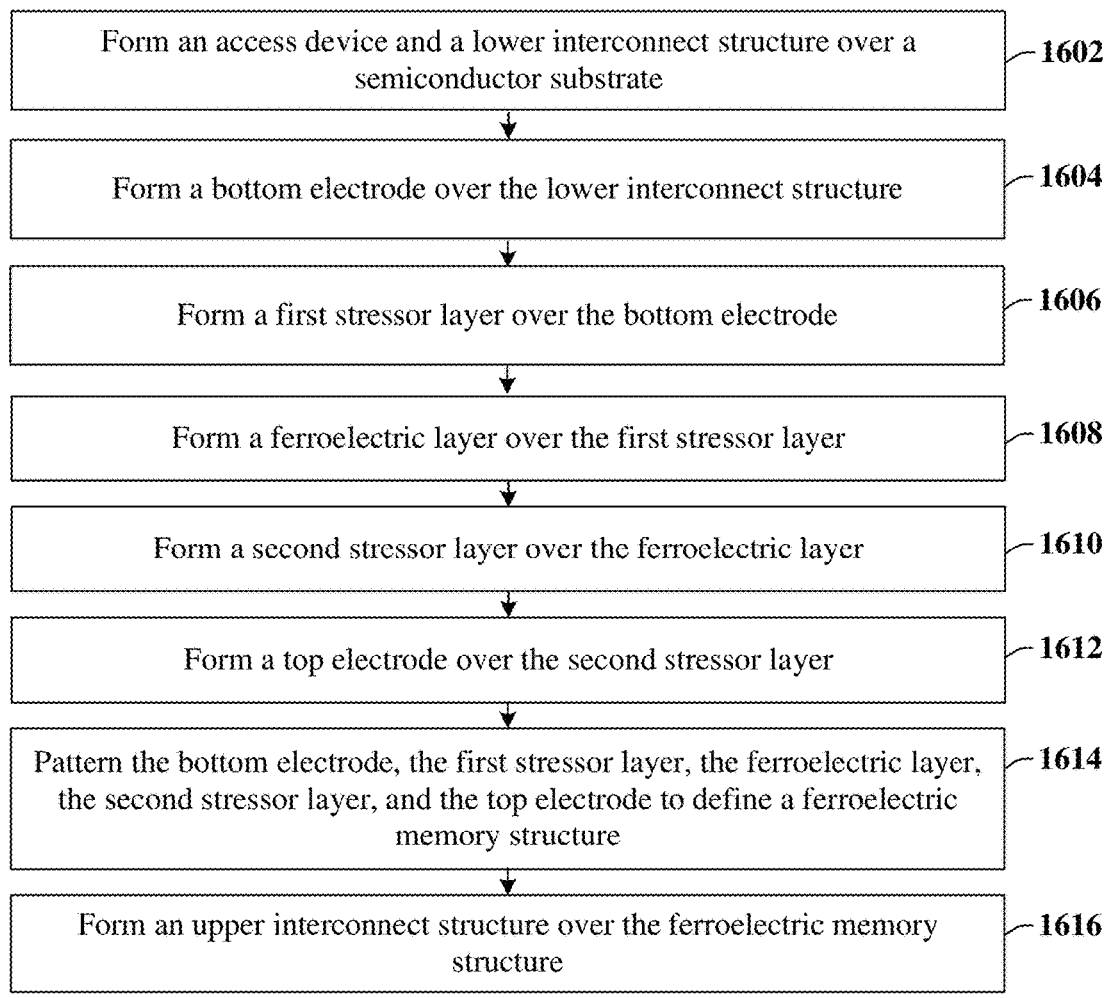
FIG. 16 illustrates a block diagram of some embodiments of the method of FIGS. 8-15.

With respect to FIG. 16, a flowchart 1600 illustrating some embodiments of a method for forming a memory device comprising stressor layers is provided. The method may, for example, correspond to the method of FIGS. 8-15.

While the disclosed flowchart 1600 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1602, an access device and a lower interconnect structure are formed over a semiconductor substrate. See, for example, FIG. 8.

At 1604, a bottom electrode is formed over the lower interconnect structure. See, for example, FIG. 9.

At 1606, a first stressor layer is formed over the bottom electrode. See, for example, FIG. 10.

At 1608, a ferroelectric layer is formed over the first stressor layer. See, for example, FIG. 11.

At 1610, a second stressor layer is formed over the ferroelectric layer. See, for example, FIG. 12.

At 1612, a top electrode is formed over the second stressor layer. See, for example, FIG. 13.

At 1614, the bottom electrode, the first stressor layer, the ferroelectric layer, the second stressor layer, and the top electrode are patterned to define a ferroelectric memory structure. See, for example, FIG. 14.

At 1616, an upper interconnect structure is formed over the ferroelectric memory structure. See, for example, FIG. 15.

With reference to FIGS. 17-25, a series of cross-sectional views 1700-2500 of some embodiments of a method for forming a memory device in which a 1T ferroelectric memory device comprises a stressor layer is provided. The memory device may, for example, be as described with regard to FIG. 4. Although FIGS. 17-25 are described in relation to a method, it will be appreciated that the structures disclosed in FIGS. 17-25 are not limited to such a method, but instead may stand alone as structures independent of the method.

Figure 17:
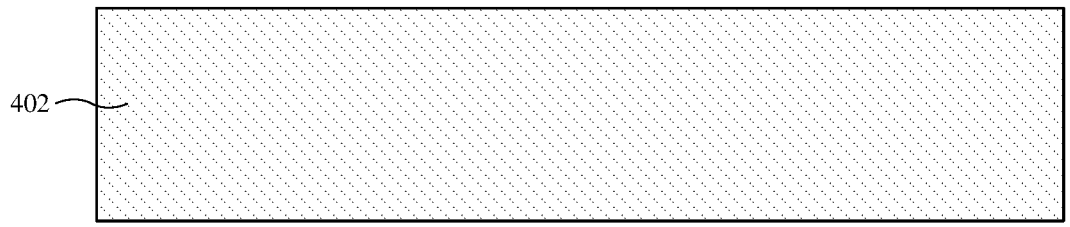
FIGS. 17-25 illustrate a series of cross-sectional views of some embodiments of a method for forming a memory device in which a 1T ferroelectric memory device comprises a stressor layer.

As illustrated by the cross-sectional view 1700 of FIG. 17, a semiconductor substrate 402 is provided. The semiconductor substrate 402 may, for example, be or comprise a silicon substrate, a silicon-on-insulator (SOI) substrate, a polymer substrate, or some other suitable type of semiconductor substrate. In some embodiments, the semiconductor substrate 402 is as described with regard to FIG. 4.

Figure 18:
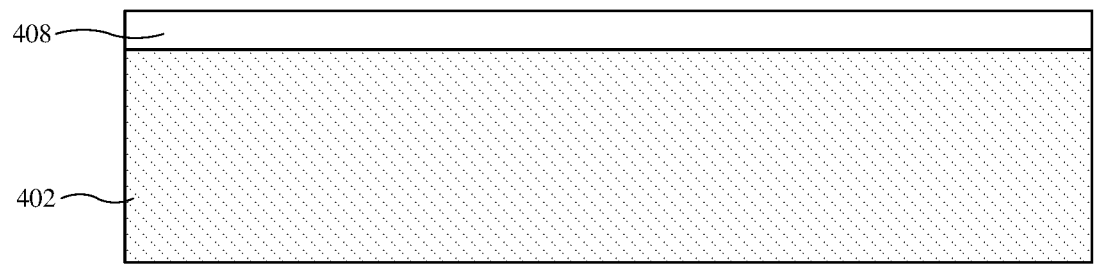

As illustrated by the cross-sectional view 1800 of FIG. 18, a gate dielectric layer 408 is formed over the semiconductor substrate 402. The gate dielectric layer 408 may be formed by, for example, depositing the gate dielectric layer 408 by CVD, PVD, ALD, some other suitable deposition process, or any combination of the foregoing. In some embodiments, the gate dielectric layer 408 is as described with regard to FIG. 4.

Figure 19:
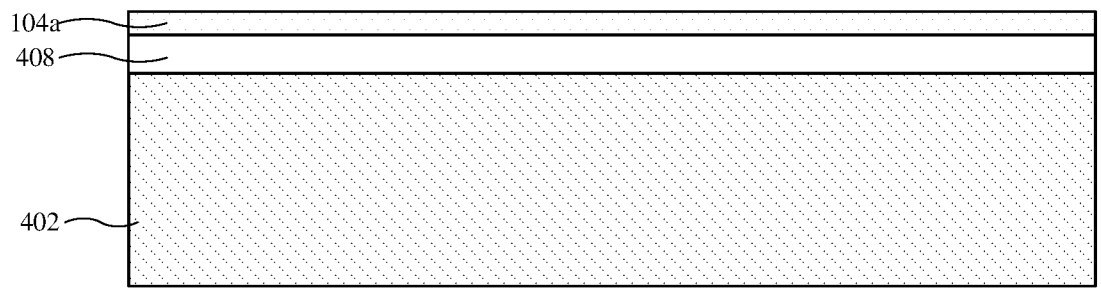

As illustrated by the cross-sectional view 1900 of FIG. 19, a first stressor layer 104a is formed over the gate dielectric layer 408. A process for forming the first stressor layer 104a may be or comprise depositing the first stressor layer 104a by DC sputtering, PVD, CVD, ALD, some other suitable deposition process, or any combination of the foregoing. In some embodiments, the first stressor layer 104a is as described with regard to FIG. 4.

Figure 20:
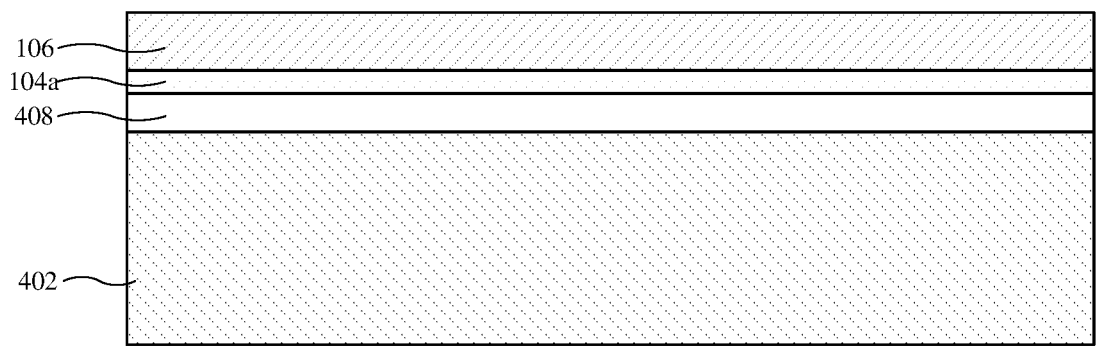

As illustrated by the cross-sectional view 2000 of FIG. 20, a ferroelectric layer 106 is formed over the first stressor layer 104a. The ferroelectric layer 106 is polycrystalline and has a plurality of crystalline phases. Further, the ferroelectric layer 106 has a remanent polarization. The first stressor layer 104a has a CTE greater than that of the ferroelectric layer 106. This promotes a formation of orthorhombic phase crystals in the ferroelectric layer 106, which, in turn, increases the remanent polarization of the ferroelectric layer 106. In some embodiments, a process for forming the ferroelectric layer 106 may be as described in FIG. 11. In some embodiments, the ferroelectric layer 106 is as described in FIG. 4.

Figure 21:
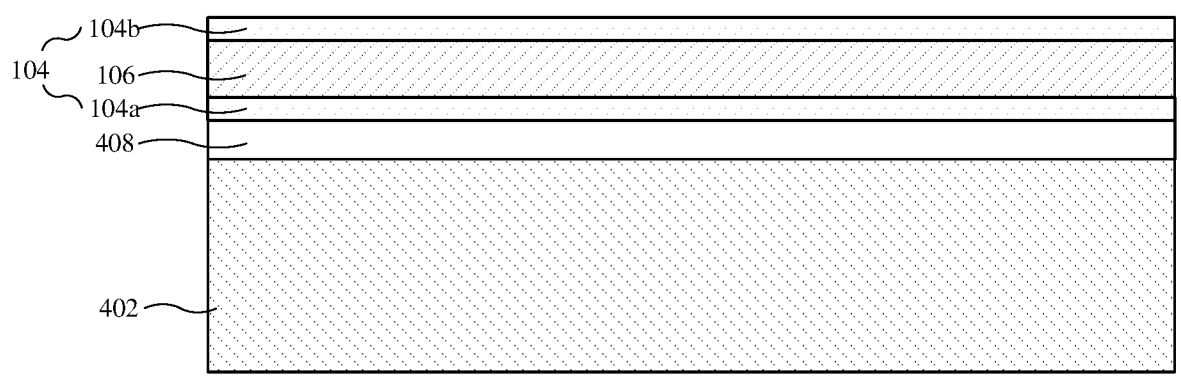

As illustrated by the cross-sectional view 2100 of FIG. 21, a second stressor layer 104b is formed over the ferroelectric layer 106. A process for forming the second stressor layer 104b may be or comprise depositing the second stressor layer 104b by DC sputtering, PVD, CVD, ALD, some other suitable deposition process, or any combination of the foregoing. In some embodiments, the second stressor layer 104b is as described with regard to FIG. 4.

Figure 22:
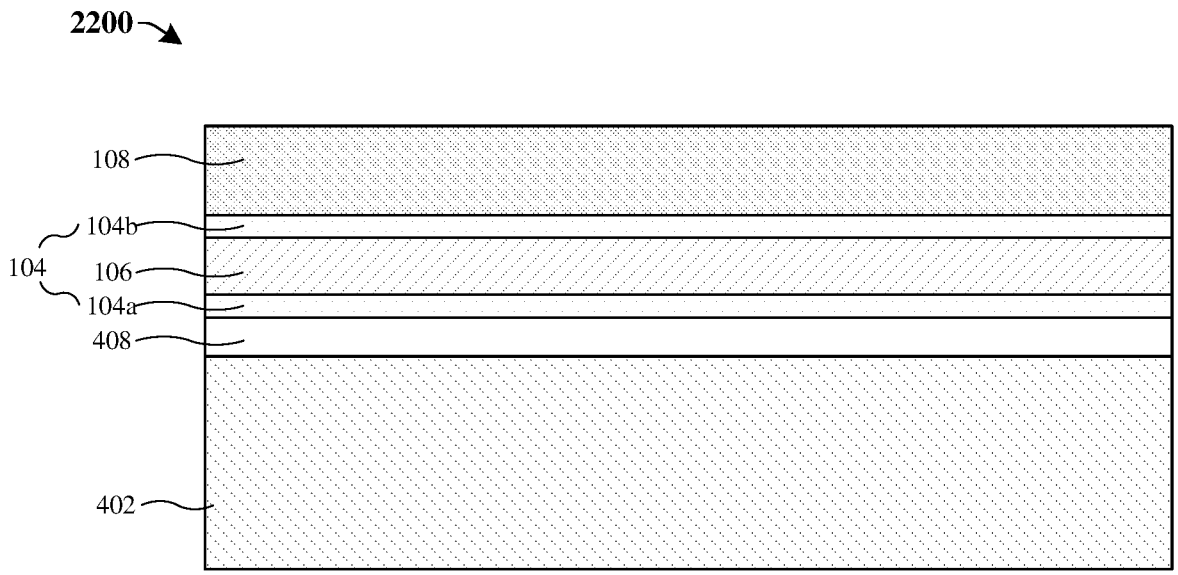

As illustrated by the cross-sectional view 2200 of FIG. 22, a top electrode 108 is formed over the second stressor layer 104b. The second stressor layer 104b has a CTE greater than that of the ferroelectric layer 106 and a Gibbs free energy of oxide formation greater than that of the top electrode 108. This promotes a formation of orthorhombic phase crystals in the ferroelectric layer 106 and inhibits a formation of a dead layer between the ferroelectric layer 106 and the top electrode 108, which, in turn, increases the remanent polarization of the ferroelectric layer 106. A process for forming the top electrode 108 may be as described in FIG. 13. In some embodiments, the top electrode 108 is as described with regard to FIG. 4.

Figure 23:
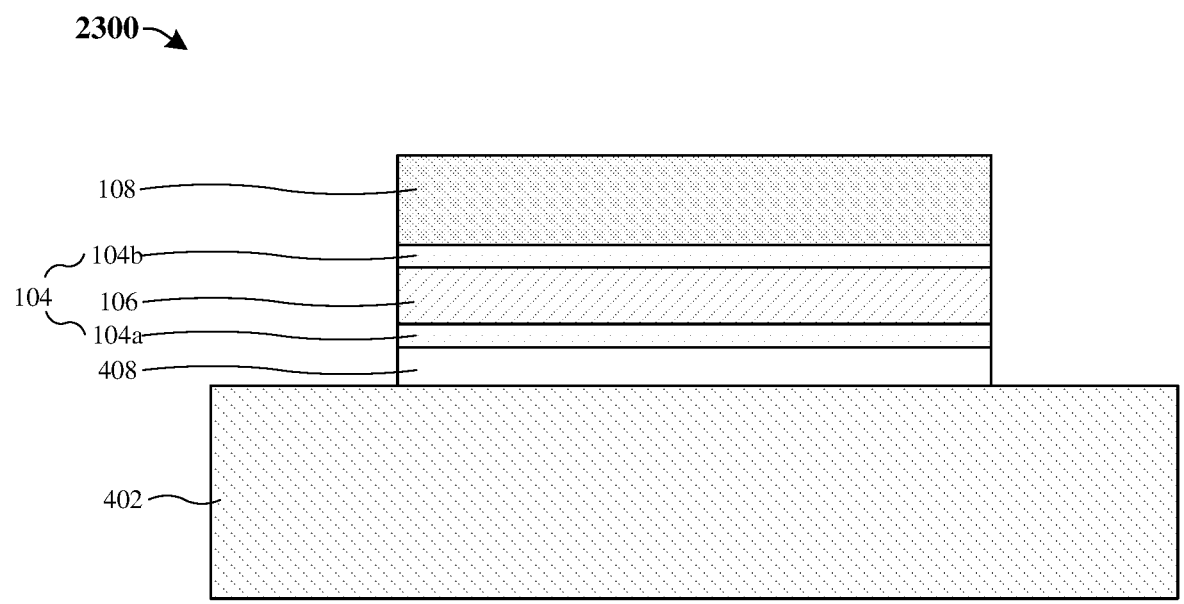

As illustrated by the cross-sectional view 2300 of FIG. 23, the gate dielectric layer 408, the first stressor layer 104a, the ferroelectric layer 106, the second stressor layer 104b, and the top electrode 108 are patterned to form a columnar gate stack. The patterning may, for example, be performed by a photolithography/etching process and/or by some other suitable process. In some embodiments, the patterning comprises: forming a hard mask (not shown) over the top electrode 108 using a photolithography/etching process; and subsequently etching the gate dielectric layer 408, the first stressor layer 104a, the ferroelectric layer 106, the second stressor layer 104b, and the top electrode 108 with the hard mask in place.

Figure 24:
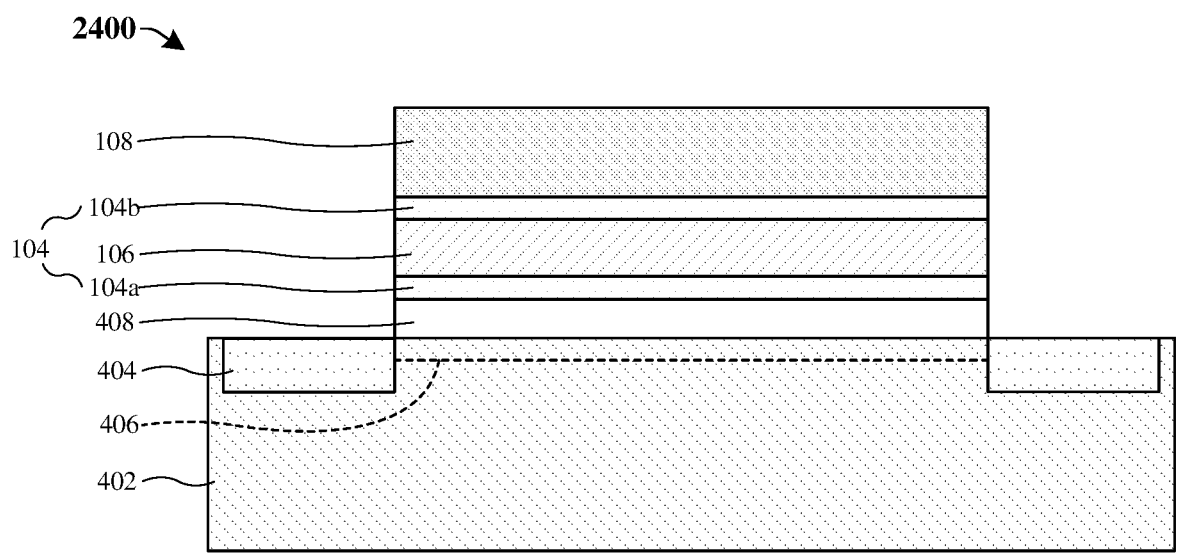

As illustrated by the cross-sectional view 2400 of FIG. 24, the semiconductor substrate 402 is doped to form a pair of source/drain regions 404 in the semiconductor substrate 402. The source/drain regions 404 are respectively on opposite sides of the columnar gate stack and demarcate a channel region 406 underlying the columnar gate stack. The doping may, for example, be performed by ion implantation and/or some other suitable doping process.

Figure 25:
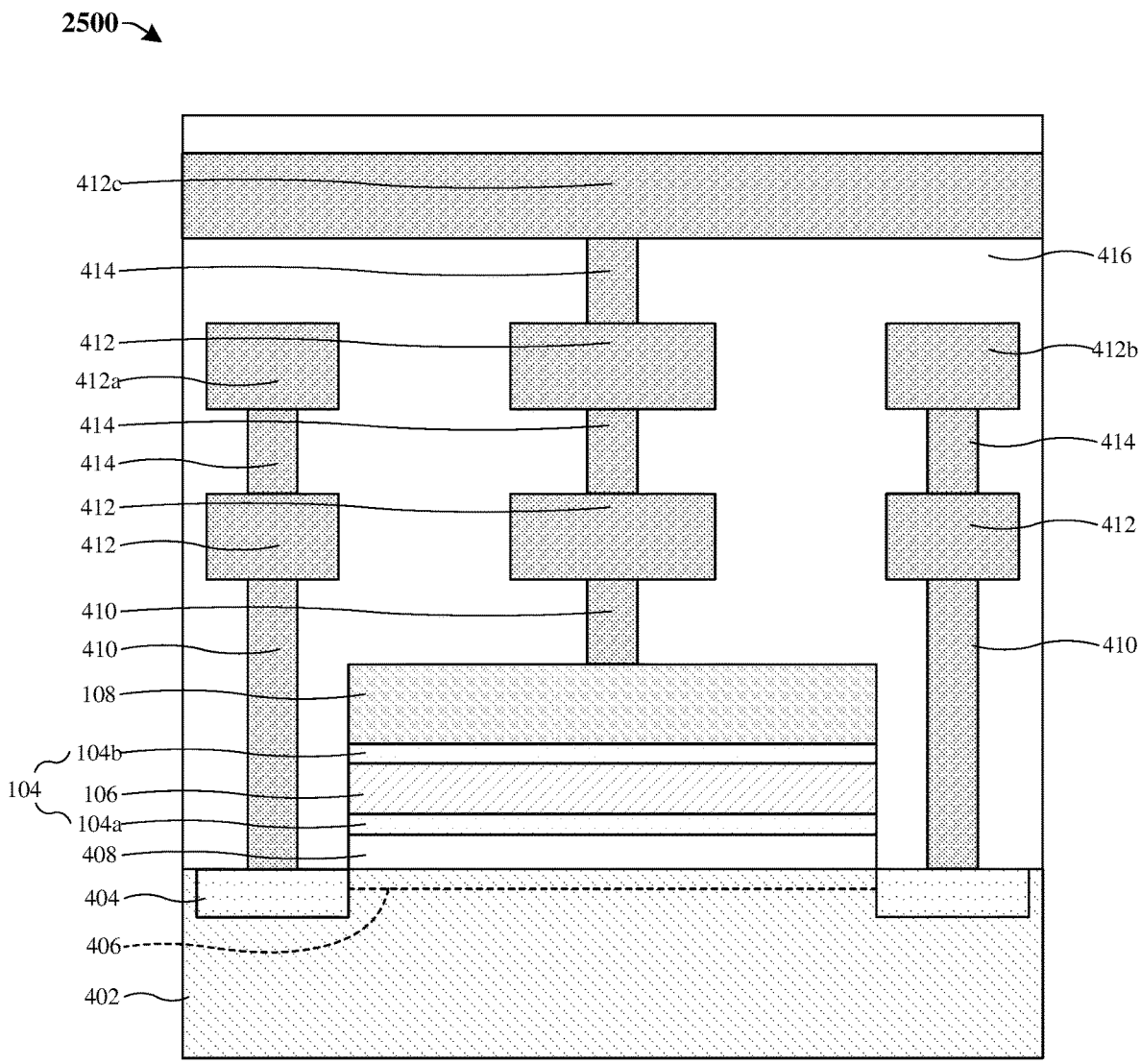

As illustrated by the cross-sectional view 2500 of FIG. 25, an interconnect dielectric layer 416 is formed over the semiconductor substrate 402. Further, a plurality of contact vias 410 are formed in the interconnect dielectric layer 416 to contact the pair of source/drain regions 404 and the top electrode 108, respectively. In some embodiments, a plurality of wires 412 (e.g., metal lines) and a plurality of interlevel vias 414 are formed in the interconnect dielectric layer 416. The plurality of wires 412, the plurality of interlevel vias 414, and the plurality of contact vias 410 are electrically coupled to define conductive paths. It will be appreciated that any number of conductive wires 412 and/or interlevel vias 414 may be alternately formed over one another in the interconnect dielectric layer 416. In yet further embodiments, the plurality of contact vias 410, the plurality of wires 412, and the plurality of interlevel vias 414 may be referred to as an interconnect structure. In some embodiments, the interconnect structure is as described in FIG. 4.

Figure 26:
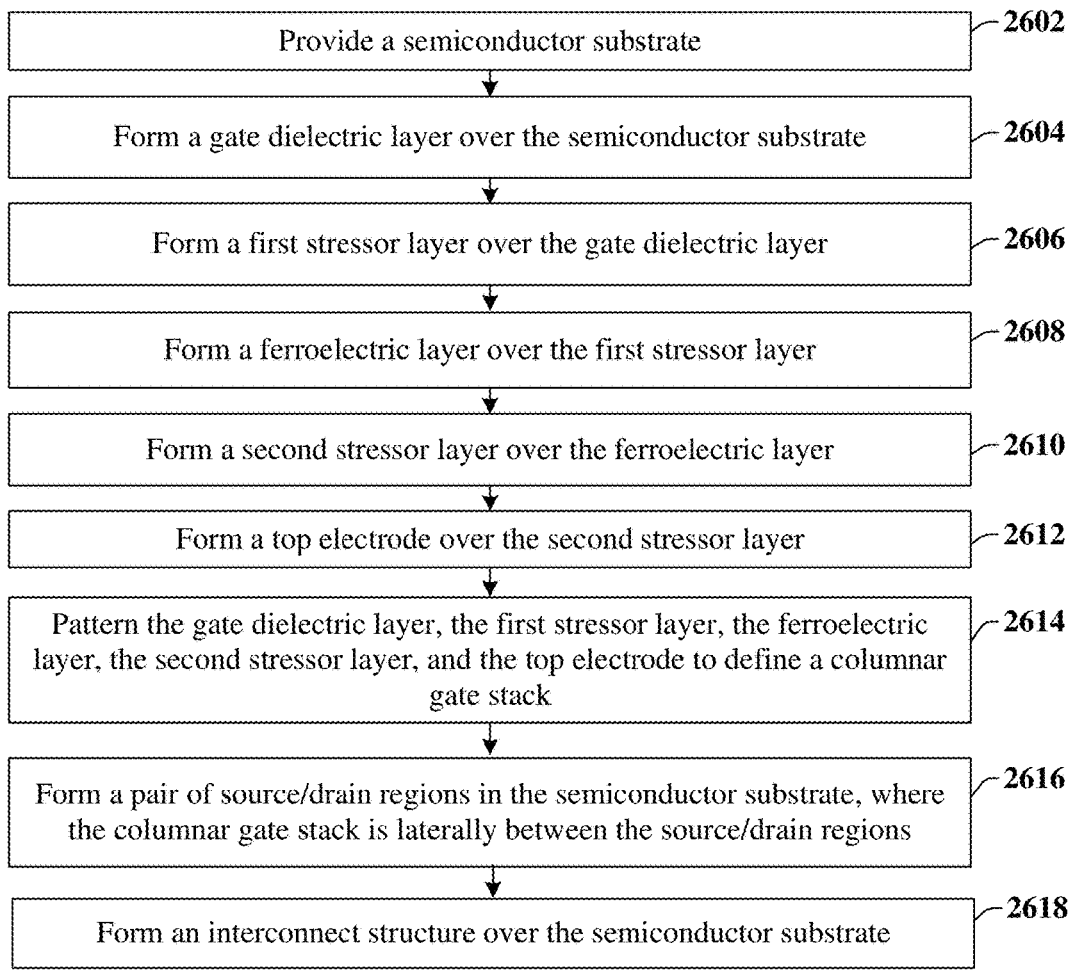
FIG. 26 illustrates a block diagram of some embodiments of the method of FIGS. 17-25.

With respect to FIG. 26, a flowchart 2600 illustrating some embodiments of a method for forming a 1T ferroelectric memory device comprising stressor layers is provided. The method may, for example, correspond to the method of FIGS. 17-25.

While the disclosed flowchart 2600 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2602, a semiconductor substrate is provided. See, for example, FIG. 17.

At 2604, a gate dielectric layer is formed over the semiconductor substrate. See, for example, FIG. 18.

At 2606, a first stressor layer is formed over the gate dielectric layer. See, for example, FIG. 19.

At 2608, a ferroelectric layer is formed over the first stressor layer. See, for example, FIG. 20.

At 2610, a second stressor layer is formed over the ferroelectric layer. See, for example, FIG. 21.

At 2612, a top electrode is formed over the second stressor layer. See, for example, FIG. 22.

At 2614, the gate dielectric layer, the first stressor layer, the ferroelectric layer, the second stressor layer, and the top electrode are patterned to define a columnar gate stack. See, for example, FIG. 23.

At 2616, a pair of source/drain regions are formed in the semiconductor substrate, where the columnar gate stack is laterally between the source/drain regions. See, for example, FIG. 24.

At 2618, an interconnect structure is formed over the semiconductor substrate. See, for example, FIG. 25.

Accordingly, in some embodiments, the present disclosure relates to a memory device comprising a semiconductor substrate, a first electrode disposed over the semiconductor substrate, a ferroelectric layer disposed between the first electrode and the semiconductor substrate, and a first stressor layer separating the first electrode from the ferroelectric layer, wherein the first stressor layer has a coefficient of thermal expansion greater than that of the ferroelectric layer.

In other embodiments, the present disclosure relates to A method for forming a memory device, comprising, depositing a ferroelectric layer over a semiconductor substrate, wherein the ferroelectric layer comprises a first material, depositing a first stressor layer over the ferroelectric layer, wherein the first stressor layer comprises a second material different than the first material, and depositing a first electrode over the first stressor layer and comprising a third material different than the first material and the second material, wherein the first electrode, the first stressor layer, and the ferroelectric layer form a memory structure, and wherein the first stressor layer is configured to increase an orthorhombic phase in the ferroelectric layer.

In yet other embodiments, the present disclosure relates to A memory device comprising a memory cell, wherein the memory cell comprises an electrode disposed over a semiconductor substrate, a ferroelectric layer vertically stacked with the electrode, and a stressor layer disposed between the electrode from the ferroelectric layer, wherein the stressor layer is configured to apply tensile stress to the ferroelectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a memory device, comprising:
depositing a first ferroelectric layer over a semiconductor substrate, wherein the first ferroelectric layer comprises a first material;
depositing a first stressor layer over the first ferroelectric layer, wherein the first stressor layer comprises a second material different than the first material;
depositing a second ferroelectric layer over the first stressor layer, wherein the second ferroelectric layer comprises the first material;
depositing a second stressor layer over the second ferroelectric layer, wherein the second stressor layer comprises the second material; and
depositing a first electrode over the second stressor layer and comprising a third material different than the first material and the second material,
wherein the first electrode, the first stressor layer, the first ferroelectric layer, the second stressor layer, and the second ferroelectric layer form a memory structure, wherein the first and second stressor layers are configured to increase an orthorhombic phase in and apply tensile stress on the first and second ferroelectric layers.

2. The method of claim 1, wherein the first stressor layer has a greater coefficient of thermal expansion than the first ferroelectric layer.

3. The method of claim 1, wherein the first stressor layer has a greater Gibbs free energy of oxide formation than the first electrode.

4. The method of claim 1, further comprising:
depositing a second electrode over the semiconductor substrate before depositing the first ferroelectric layer, wherein the second electrode comprises the third material; and
depositing a third stressor layer over the second electrode before depositing the first ferroelectric layer, wherein the third stressor layer comprises the second material, and wherein the second electrode and the third stressor layer further form the memory structure.

5. The method of claim 4, wherein the third stressor layer has a greater coefficient of thermal expansion than the first ferroelectric layer and a greater Gibbs free energy of oxide formation than the second electrode.

6. The method of claim 1, further comprising:
etching the first electrode, the first stressor layer, and the first ferroelectric layer to form a gate stack; and
doping the semiconductor substrate to form a pair of source/drain regions bordering the gate stack respectively on opposite sides of the gate stack.

7. The method of claim 1, wherein the first stressor layer is conductive.

8. A method for forming a memory device, comprising:
depositing a memory film over a substrate, wherein the memory film comprises a bottom electrode layer, a ferroelectric layer, a first stressor layer, a second stressor layer, and a top electrode layer that are stacked; and
patterning the memory film to form a memory structure;
wherein the ferroelectric layer is between and directly contacts the first and second stressor layers, wherein the first stressor layer, the second stressor layer, and the ferroelectric layer are between the bottom and top electrode layers, wherein the first stressor layer and the second stressor layer are metal and have a greater coefficient of thermal expansion (CTE) than the ferroelectric layer, which has a greater CTE than the bottom and top electrode layers.

9. The method according to claim 8, wherein the first stressor layer is between the bottom electrode layer and the ferroelectric layer and has a greater Gibbs free energy of oxide formation than the bottom electrode layer.

10. The method according to claim 8, wherein the first and second stressor layers are between the bottom and top electrode layers and respectively directly contact the bottom and top electrode layers.

11. The method according to claim 8, further comprising:
forming an access transistor on the substrate; and
forming a stack of conductive features over the access transistor and comprising a via extending from a source or drain region of the access transistor and electrically coupled to a wire overlying the via;
wherein the memory film is deposited over the wire with the bottom electrode layer electrically coupled to the wire.

12. A method for forming a memory device, comprising:
depositing a memory film over a substrate, wherein the memory film comprises a ferroelectric layer, a first interfacial layer, and a first electrode layer that are stacked; and
patterning the memory film to form a memory structure;
wherein the first interfacial layer is between the first electrode layer and the ferroelectric layer, wherein the first interfacial layer has a greater Gibbs free energy of oxide formation than the first electrode layer, and wherein the first interfacial layer applies tensile stress on the ferroelectric layer.

13. The method according to claim 12, wherein the first interfacial layer has a greater coefficient of thermal expansion than the first electrode layer.

14. The method according to claim 12, wherein the memory film further comprises a second interfacial layer underlying the ferroelectric layer, wherein the second interfacial layer is configured to apply tensile stress on the ferroelectric layer, and wherein the ferroelectric layer is between the first and second interfacial layers.

15. The method according to claim 14, wherein the memory film further comprises a gate dielectric layer, wherein the second interfacial layer is between the gate dielectric layer and the substrate, and wherein the method further comprises:
performing an etch into the memory film to form a gate stack; and
doping the substrate to form a pair of source/drain regions bordering the gate stack respectively on opposite sides of the gate stack.

16. The method according to claim 14, wherein the memory film further comprises a second electrode layer underlying the ferroelectric layer, wherein the second interfacial layer is between the second electrode layer and the ferroelectric layer, and wherein the memory film is elevated above the substrate and separated from the substrate by a plurality of conductive interconnect features.

17. The method of claim 1, wherein the first and second stressor layers consist essentially of metal and have a greater coefficient of thermal expansion than the first and second ferroelectric layers, which have a greater coefficient of thermal expansion than the first electrode.

18. The method according to claim 8, wherein the memory film comprises a plurality of ferroelectric layers and a plurality of stressor layers that are alternatingly stacked from the bottom electrode layer to the top electrode layer, wherein the plurality of ferroelectric layers comprise the ferroelectric layer and share a common material, wherein the plurality of stressor layers comprise the first and second stressor layers and share a common material, and wherein the plurality of stressor layers apply tensile stress on the plurality of ferroelectric layers and have greater Gibbs free energy of oxide formation than the bottom and top electrode layers.

19. The method according to claim 12, wherein the memory film comprises a plurality of ferroelectric layers and a plurality of interfacial layers that are alternatingly stacked with the first electrode layer, wherein the plurality of ferroelectric layers comprise the ferroelectric layer, wherein the plurality of interfacial layers comprise the first interfacial layer, wherein the plurality of interfacial layers are conductive, share a common material, and have a higher coefficient of thermal expansion than the plurality of ferroelectric layers, which have a higher coefficient of thermal expansion than the first electrode layer, and wherein the plurality of interfacial layers apply tensile stress on the plurality of ferroelectric layers.

20. The method according to claim 19, wherein the interfacial layers consist essentially of metal.

* * * * *